(12) United States Patent
Baetzold et al.

(10) Patent No.: US 11,591,501 B2
(45) Date of Patent: Feb. 28, 2023

(54) BARRIER ADHESIVE COMPOSITIONS AND ARTICLES

(71) Applicant: 3M INNOVATIVE PROPERTIES COMPANY, St. Paul, MN (US)

(72) Inventors: John P. Baetzold, North St. Paul, MN (US); Claire Hartmann-Thompson, Lake Elmo, MN (US); Jitendra S. Rathore, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 180 days.

(21) Appl. No.: 16/769,291

(22) PCT Filed: Dec. 5, 2018

(86) PCT No.: PCT/IB2018/059675
§ 371 (c)(1),
(2) Date: Jun. 3, 2020

(87) PCT Pub. No.: WO2019/111182
PCT Pub. Date: Jun. 13, 2019

(65) Prior Publication Data
US 2020/0291277 A1 Sep. 17, 2020

Related U.S. Application Data

(60) Provisional application No. 62/595,209, filed on Jun. 12, 2017.

(51) Int. Cl.
*C09J 147/00* (2006.01)
*C09J 7/38* (2018.01)
*H01L 51/52* (2006.01)

(52) U.S. Cl.
CPC .............. *C09J 147/00* (2013.01); *C09J 7/385* (2018.01); *H01L 51/5253* (2013.01);
(Continued)

(58) Field of Classification Search
CPC ... C09J 123/00–123/36; C09J 183/00–183/16; C09J 7/38–7/387
See application file for complete search history.

(56) References Cited

U.S. PATENT DOCUMENTS

| 4,696,719 A | 9/1987 | Bischoff |
| 4,722,515 A | 2/1988 | Ham |

(Continued)

FOREIGN PATENT DOCUMENTS

| WO | WO 2000-26973 | 5/2000 |
| WO | WO 2015-088932 | 6/2015 |

(Continued)

OTHER PUBLICATIONS

Dire et al. (eds. L. Klein et al.). "Architecture of Silsesquioxanes". Handbook of Sol-Gel Science and Technology, (2016); pp. 1-34.*

(Continued)

*Primary Examiner* — Prashant J Khatri
(74) *Attorney, Agent, or Firm* — Jeffrey M. Olofson

(57) ABSTRACT

Barrier adhesive compositions include at least one polyisobutylene-containing polymer and a curable silsesquioxane additive. The curable silsesquioxane additive may contain free radically polymerizable groups. Barrier film articles include the barrier adhesive compositions and a film. The barrier film articles can be used to encapsulate organic electronic devices.

20 Claims, 1 Drawing Sheet

(52) U.S. Cl.
CPC .... *C09J 2203/326* (2013.01); *C09J 2301/122* (2020.08); *C09J 2301/414* (2020.08); *C09J 2423/006* (2013.01); *C09J 2423/046* (2013.01); *C09J 2433/00* (2013.01)

(56) References Cited

U.S. PATENT DOCUMENTS

| | | | |
|---|---|---|---|
| 4,842,893 | A | 6/1989 | Yializis |
| 4,954,371 | A | 9/1990 | Yializis |
| 5,018,048 | A | 5/1991 | Shaw |
| 5,032,461 | A | 7/1991 | Shaw |
| 5,097,800 | A | 3/1992 | Shaw |
| 5,125,138 | A | 6/1992 | Shaw |
| 5,440,446 | A | 8/1995 | Shaw |
| 5,547,908 | A | 8/1996 | Furuzawa |
| 5,952,419 | A * | 9/1999 | DeGroot, Jr. ........... C08L 83/04 524/588 |
| 6,045,864 | A | 4/2000 | Lyons |
| 6,214,422 | B1 | 4/2001 | Yializis |
| 6,231,939 | B1 | 5/2001 | Shaw |
| 6,936,131 | B2 | 8/2005 | McCormick |
| 7,940,004 | B2 | 5/2011 | Padiyath |
| 8,232,350 | B2 | 7/2012 | Fujita |
| 11,028,289 | B2 | 6/2021 | Waid |
| 2005/0228096 | A1 | 10/2005 | Kirsten |
| 2009/0026934 | A1 | 1/2009 | Fujita |
| 2010/0063221 | A1 | 3/2010 | Manabe |
| 2011/0073901 | A1 | 3/2011 | Fujita |
| 2012/0009366 | A1 | 1/2012 | Galbraith |
| 2014/0235742 | A1 | 8/2014 | Cho |
| 2014/0377554 | A1 | 12/2014 | Cho |
| 2015/0056757 | A1 | 2/2015 | Liu |
| 2015/0162568 | A1 | 6/2015 | Bai |
| 2015/0240134 | A1 | 8/2015 | Keite-Telgenbuscher |
| 2017/0298259 | A1 | 10/2017 | Schuh |

FOREIGN PATENT DOCUMENTS

| | | |
|---|---|---|
| WO | WO 2017-031031 | 2/2017 |
| WO | WO 2017-031074 | 2/2017 |

OTHER PUBLICATIONS

Willenbacher et al. (eds. I. Benedek et al.). "Chapter 4: Polyisobutene-Based Pressure Sensitive Adhesives". Technology of Pressure Sensitive Adhesives and Products, (2009); pp. 4-1 to 4-18.*

Affinito, "Polymer-Oxide Transparent Barrier Layers", Society of Vacuum Coaters, The 39th Annual Technical Conference Proceedings, 1996, pp. 392-397.

Affinito, "Vacuum deposited polymer/metal multilayer films for optical application", Thin Solid Films, 1995, vol. 270, pp. 43-48.

Shaw "A New High-Speed Process for Vapor Depositing Acrylate Thin Films: An Update", Society of Vacuum Coaters, The 36th Annual Technical Conference Proceedings, Apr. 1993, pp. 348-352.

Shaw, "A New Vapor Deposition Process for Coating Paper and Polymer Webs", The 6th International Vacuum Web Coating Conference, Oct. 28, 1992, pp. 18-24.

Shaw, "Use of Evaporated Acrylate Coatings to Smooth the Surface of Polyester and Polypropylene Film and Aluminum Film Substrates", RadTech North America UV/EB Conference Proceedings, Apr./May 1996, vol. 2, pp. 701-707.

Shaw, "Use of Vapor Deposited Acrylate Coatings to Improve the Barrier Properties of Metallized Film", Society of Vacuum Coaters, The 37th Annual Technical Conference Proceedings, 1994, pp. 240-244.

International Search Report for PCT International Application No. PCT/IB2018/059675, dated Feb. 21, 2019, 4 pages.

* cited by examiner

BARRIER ADHESIVE COMPOSITIONS AND ARTICLES

FIELD OF THE DISCLOSURE

This disclosure relates to barrier adhesive compositions and to adhesive barrier articles that include a layer of barrier adhesive.

BACKGROUND

Organic electronic devices require protection from moisture and oxygen in order to provide adequately long lifetimes for commercial applications. An encapsulant is therefore utilized to protect the device from contact with moisture and oxygen. Glass is one commonly used encapsulant, but glass significantly impairs the flexibility of the device. It can therefore be desirable to replace glass with flexible barrier films. Flexible barrier films can enable flexible devices as well as lighter, thinner, more rugged rigid devices.

Flexible barrier films have been commercialized for general use in organic electronic devices. A flexible barrier film is typically laminated to the device it will protect using an adhesive. It is therefore important that the adhesive also have good barrier properties to minimize moisture and oxygen bond line edge ingress. Examples of barrier adhesives include US Patent Publications 2011/0073901, 2009/0026934, and U.S. Pat. No. 8,232,350 (Fujita et al.). Other barrier adhesives include US Patent Publication No. 2014/0377554 (Cho et al.) which include nanoclays as a "moisture blocker" and U.S. Pat. No. 6,936,131 (McCormick et al.) which include added desiccant and/or a getterer.

SUMMARY

Disclosed herein are barrier adhesive compositions, barrier adhesive articles, and devices that incorporate barrier adhesive articles. Among the barrier adhesive compositions are barrier adhesive compositions comprising at least one polyisobutylene-containing polymer, and a curable silsesquioxane additive.

Among the barrier film articles are barrier film article constructions comprising a barrier film with a first major surface and a second major surface, and a pressure sensitive adhesive layer with a first major surface and a second major surface where the second major surface of the pressure sensitive adhesive layer is in contact with the first major surface of the barrier film. The pressure sensitive adhesive layer comprises at least one polyisobutylene-containing polymer, and a curable or cured silsesquioxane additive.

Also disclosed are encapsulated organic electronic devices comprising a device substrate, an organic electronic device disposed on the device substrate, and a barrier film article disposed on the organic electronic device and at least a portion of the device substrate. The barrier film article comprises a barrier film with a first major surface and a second major surface, and a pressure sensitive adhesive layer with a first major surface and a second major surface where the second major surface of the pressure sensitive adhesive layer is in contact with the first major surface of the barrier film. The pressure sensitive adhesive layer comprises a polyisobutylene-containing polymer, and a cured silsesquioxane additive. The pressure sensitive adhesive layer of the barrier film article and the device substrate encapsulate the organic electronic device.

BRIEF DESCRIPTION OF THE DRAWINGS

The present application may be more completely understood in consideration of the following detailed description of various embodiments of the disclosure in connection with the accompanying drawings.

Figure 1:
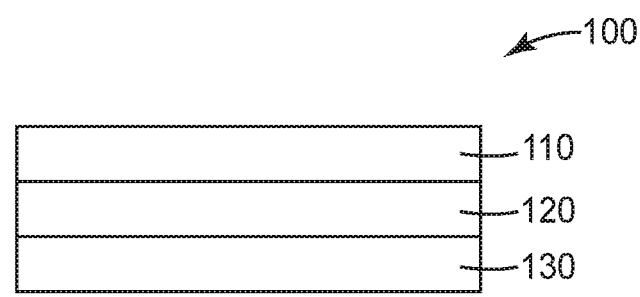
FIG. 1 shows a cross-sectional view of an embodiment of an article of this disclosure.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Organic electronic devices require protection from moisture and oxygen in order to provide adequately long lifetimes for commercial applications. An encapsulant is therefore utilized to protect the device from contact with moisture and oxygen. Glass is one commonly used encapsulant, but glass significantly impairs the flexibility of the device. It can therefore be desirable to replace glass with flexible barrier articles such as flexible barrier films. Flexible barrier films can be used with flexible devices and can help to make such devices lighter, and thinner than more rigid devices.

Flexible barrier articles include flexible barrier films and a layer of adhesive. Typically the adhesive is a pressure sensitive adhesive. Adhesive compositions suitable for use in flexible barrier articles have a wide range of property requirements. Besides adhering to the articles to which they are to provide the barrier property, the barrier adhesives should prevent or at least hinder the passage of moisture and oxygen. Additionally, when used in optical devices, it is often desirable that the barrier adhesive and barrier film have desirable optical properties, such as being optically transparent or optically clear.

One indicator of the barrier properties of a layer of pressure sensitive adhesive is the free volume. The free volume of a material is defined as the difference between the bulk volume and the sum of the hard core and vibrational volumes of the constituent building blocks. Thus, the free volume of a polymer is the unoccupied space, or vacancies, available for segmental motion. Free volume concepts have long been used to interpret and explain the glass transition and glass transition temperature, viscoelastic and relaxation behaviors, diffusion, and other transport properties of polymer systems.

Polymer adhesion is a complex phenomenon, including contributions of adsorption, diffusion, and viscoelastic deformation processes. From this standpoint, it is reasonable to expect that free volume affects the adhesive behavior of polymers. However, the correlation of adhesion and free volume has not been extensively explored, especially for pressure sensitive adhesives. Pressure sensitive adhesives (PSAs) are a special class of viscoelastic polymers that form strong adhesive bonds with substrates under application of slight external pressures over short periods of time. To be a PSA, a polymer should possess both high fluidity under applied bonding pressure, to form good adhesive contact, and high-cohesive strength, and elasticity, which are necessary for resistance to debonding stresses and for dissipation of mechanical energy at the stage of adhesive bond failure under detaching force. These conflicting properties are difficult to combine in a single polymer material. Thus, the number of pressure sensitive adhesive materials that have proven to be suitable for use as barrier adhesives, in other words, ones that have the right combination of adhesive properties and yet a relatively low free volume so as to prevent the passage of moisture and oxygen, is fairly limited. Among the pressure sensitive adhesive polymer materials that have been found useful are polyisobutylenes and polyisobutylene copolymers, such as butyl rubbers.

While polyisobutylenes and butyl rubbers have been used to form barrier film articles, improvement of the barrier properties without sacrificing other desirable properties, such as the adhesive and optical properties is desirable. Among the techniques that have been used include the use of additives, such as nanoparticles and nanoclays have been explored in PCT Publication Nos. WO 2017/031031 and WO 2017/031074.

In the present disclosure, a polyisobutylene-containing polymer is used in combination with a curable silsesquioxane additive. In this context, polyisobutylene-containing polymers include polyisobutylene polymers and polyisobutylene copolymers, such as, for example butyl rubbers. The curable silsesquioxane additive comprises a cage, linear or branched silsesquioxane. It has been discovered that even small quantities of the curable silsesquioxane additive improves the barrier properties of the pressure sensitive adhesive without adversely affecting the adhesive properties or the optical properties. It has further been discovered that the curable silsesquioxane additive does not adversely affect the flexibility of the polyisobutylene-based matrix of the adhesive layer. Unlike particles, even small particles such as nanoparticles, which tend to adversely affect the flexibility of the polymeric matrices to which they are added, the curable silsesquioxane additives do not adversely affect the flexibility of the poly-isobutylene-based matrix of the adhesive layer.

It is surprising that polyisobutylene-containing polymers and curable silsesquioxane additives can be used together as these materials have very different solubility parameters. For example, polyisobutylene-containing polymers are soluble in non-polar solvents such as alkane solvents, whereas silsesquioxane polymers typically require polar solvents such as alcohol or ketone solvents. Thus the ability of the curable silsesquioxane polymers to form compatible solutions with polyisobutylene-containing polymer solutions of non-polar solvents is surprising.

While silsesquioxanes are used as fillers and property modifiers for polymeric materials, the effect of curable silsesquioxane additives on the barrier properties of a poly-isobutylene pressure sensitive adhesive is unknown, and the enhancement of barrier properties without comprising the other desirable properties of the pressure sensitive such as optical clarity, is surprising.

The effect of adding curable silsesquioxanes to polymer compositions is difficult to predict since in some instances the addition of curable silsesquioxanes increases the free volume, in other instances it decreases the free volume, and in yet other instances they can have little effect upon the free volume. A variety of different effects have been observed depending upon the nature of the organic groups present on the curable silsesquioxanes, the nature of the polymer with which the curable silsesquioxanes are blended, the blending conditions, and the like. One common concern with the use of curable silsesquioxane additives is the potential of the silsesquioxanes to agglomerate and form microdomains within the polymer blend. These microdomains can not only adversely affect the physical properties of the blend, they can also adversely affect the optical properties of the blend.

As is shown in the Examples section, polyisobutylene-based barrier adhesives which contain the curable silsesquioxane additives of this disclosure show improved barrier properties over the polyisobutylene barrier adhesive with no additive. Thus the polyisobutylene and curable silsesquioxane combination is providing unexpected improvement in barrier properties, and this improvement is achieved without adversely affecting the optical properties of the barrier adhesive.

Disclosed herein are barrier adhesive compositions comprising at least one polyisobutylene-containing polymer, and a curable silsesquioxane additive. Also disclosed herein are barrier film article constructions that comprise a barrier film with the barrier adhesive composition disposed on a major surface of the barrier film. Additionally, encapsulated organic electronic devices are disclosed that comprise a device substrate, an organic electronic device disposed on the device substrate, and a barrier film article disposed on the organic electronic device and at least a portion of the device substrate.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

The term "adhesive" as used herein refers to polymeric compositions useful to adhere together two adherends. Examples of adhesives are pressure sensitive adhesives.

Pressure sensitive adhesive compositions are well known to those of ordinary skill in the art to possess properties including the following: (1) aggressive and permanent tack, (2) adherence with no more than finger pressure, (3) sufficient ability to hold onto an adherend, and (4) sufficient cohesive strength to be cleanly removable from the adherend. Materials that have been found to function well as pressure sensitive adhesives are polymers designed and formulated to exhibit the requisite viscoelastic properties resulting in a desired balance of tack, peel adhesion, and shear holding power. Obtaining the proper balance of properties is not a simple process.

The terms "room temperature" and "ambient temperature" are used interchangeably to mean temperatures in the range of 20° C. to 25° C.

The terms "Tg" and "glass transition temperature" are used interchangeably. If measured, Tg values are determined by Differential Scanning calorimetry (DSC) at a scan rate of 10° C./minute, unless otherwise indicated. Typically, Tg values for copolymers are not measured but are calculated using the well-known Fox Equation, using the monomer Tg values provided by the monomer supplier, as is understood by one of skill in the art As used herein, the term "organic group" means a hydrocarbon group (with optional elements other than carbon and hydrogen, such as oxygen, nitrogen, sulfur, silicon, and halogens) that is classified as an aliphatic group, cyclic group, or combination of aliphatic and cyclic groups (e.g., alkaryl and aralkyl groups). In the context of the present disclosure, the organic groups are those that do not interfere with the formation of curable silsesquioxane polymer. The term "aliphatic group" means a saturated or unsaturated linear or branched hydrocarbon group. This term is used to encompass alkyl, alkenyl, and alkynyl groups, for example. The term "alkyl group" is defined herein below. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" are defined herein below. The term "heterocyclic group" means a closed ring hydrocarbon in which one or more of the atoms in the ring is an element other than carbon (e.g., nitrogen, oxygen, sulfur, etc.). The organic group can have any suitable valency but is often monovalent or divalent.

The term "hydrocarbon group" as used herein refers to any monovalent group that contains primarily or exclusively carbon and hydrogen atoms. Alkyl and aryl groups are examples of hydrocarbon groups.

The term "adjacent" as used herein when referring to two layers means that the two layers are in proximity with one another with no intervening open space between them. They may be in direct contact with one another (e.g. laminated together) or there may be intervening layers.

The term "polyisobutylene-containing" as used herein when referring to polymers, refers to polymers that include polyisobutylene units. The polymers include not only polyisobutylene homopolymers, but also copolymers of isobutylene. Examples of such copolymers include, but are not limited to, styrene-isobutlyene copolymers and butyl rubbers.

The term "silsesquioxane" as used herein refer to siloxane compounds of the general formula $(RSiO_{1.5})_n$. The silsesquioxane structure may have a linear (often referred to as a ladder structure), caged or branched configuration.

The terms "polymer" and "oligomer" are used herein consistent with their common usage in chemistry. In chemistry, an oligomer is a molecular complex that consists of a few monomer units, in contrast to a polymer, where the number of monomers is, in principle, not limited. Dimers, trimers, and tetramers are, for instance, oligomers composed of two, three and four monomers, respectively. Polymers on the other hand are macromolecules composed of many repeated subunits. Oligomers and polymers can be characterized in a number of ways besides the number of repeat units, such as by molecular weight. As used herein, polymers of polyisobutylene typically have a viscosity average molecular weight (Mv) of at least 40,000 grams/mole whereas oligomers of polyisobutylene typically have a number average molecular weight (Mn) of less than 40,000 grams/mole, often less than 5,000 grams/mole.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "heteroalkylene" refers to a divalent group that includes at least two alkylene groups connected by a thio, oxy, or —NR— where R is alkyl. The heteroalkylene can be linear, branched, cyclic, substituted with alkyl groups, or combinations thereof. Some heteroalkylenes are poloxyyalkylenes where the heteroatom is oxygen such as for example,

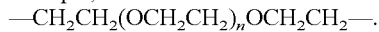

The term "arylene" refers to a divalent group that is carbocyclic and aromatic. The group has one to five rings that are connected, fused, or combinations thereof. The other rings can be aromatic, non-aromatic, or combinations thereof. In some embodiments, the arylene group has up to 5 rings, up to 4 rings, up to 3 rings, up to 2 rings, or one aromatic ring. For example, the arylene group can be phenylene.

The term "heteroarylene" refers to a divalent group that is carbocyclic and aromatic and contains heteroatoms such as sulfur, oxygen, nitrogen or halogens such as fluorine, chlorine, bromine or iodine.

The term "aralkylene" refers to a divalent group of formula —$R^a$—$Ar^a$— where $R^a$ is an alkylene and $Ar^a$ is an arylene (i.e., an alkylene is bonded to an arylene).

The term "alkoxy" refers to a monovalent group having an oxy group bonded directly to an alkyl group.

The term "aryloxy" refers to a monovalent group having an oxy group bonded directly to an aryl group.

The terms "aralkyloxy" and "alkaryloxy" refer to a monovalent group having an oxy group bonded directly to an aralkyl group or an alkaryl group, respectively.

The term "acyloxy" refers to a monovalent group of the formula —$O(CO)R^b$ where $R^b$ is alkyl, aryl, aralkyl, or alkaryl. Suitable alkyl $R^b$ groups often have 1 to 10 carbon atoms, 1 to 6 carbon atoms, or 1 to 4 carbon atoms. Suitable aryl $R^b$ groups often have 6 to 12 carbon atoms such as, for example, phenyl. Suitable aralkyl and alkaryl $R^b$ groups often have an alkyl group with 1 to 10 carbon atoms, 1 to 6 carbon atoms, or 1 to 4 carbon atoms and an aryl having 6 to 12 carbon atoms.

The term "hydrolyzable group" refers to a group that can react with water having a pH of 1 to 10 under conditions of atmospheric pressure. The hydrolyzable group is often converted to a hydroxyl group when it reacts. The hydroxyl group often undergoes further reactions. Typical hydrolyzable groups include, but are not limited to, alkoxy, aryloxy, aralkyloxy, alkaryloxy, acyloxy, or halo. As used herein, the term is often used in reference to one of more groups bonded to a silicon atom in a silyl group.

The term "halo" refers to a halogen atom such as fluoro, bromo, iodo, or chloro. When part of a reactive silyl, the halo group is often chloro.

The term "(meth)acryloyloxy group" as used herein, includes an acryloyloxy group ($-O-(CO)-CH=CH_2$) and a methacryloyloxy group ($-O-(CO)-C(CH_3)=CH_2$). Similarly, the term "(meth)acrylate" includes both acrylates and methacrylates.

The term "(meth)acryloylamino group" as used herein, includes an acryloylamino group ($-NR-(CO)-CH=CH_2$) and a methacryloylamino group ($-NR-(CO)-C(CH_3)=CH_2$) including embodiments wherein the amide nitrogen is bonded to a hydrogen, methyl group, or ethyl group (R is H, methyl, or ethyl).

The terms "free radically polymerizable" and "ethylenically unsaturated" are used interchangeably and refer to a reactive group which contains a carbon-carbon double bond which is able to be polymerized via a free radical polymerization mechanism.

Unless otherwise indicated, the terms "optically transparent", and "visible light transmissive" are used interchangeably, and refer to an article, film or adhesive that has a high light transmittance over at least a portion of the visible light spectrum (about 400 to about 700 nm). Typically, optically transparent articles have a visible light transmittance of at least 90%. The term "transparent film" refers to a film having a thickness and when the film is disposed on a substrate, an image (disposed on or adjacent to the substrate) is visible through the thickness of the transparent film. In many embodiments, a transparent film allows the image to be seen through the thickness of the film without substantial loss of image clarity. In some embodiments, the transparent film has a matte or glossy finish.

Unless otherwise indicated, "optically clear" refers to an adhesive or article that has a high light transmittance over at least a portion of the visible light spectrum (about 400 to about 700 nm), and that exhibits low haze, typically less than about 5%, or even less than about 2%. In some embodiments, optically clear articles exhibit a haze of less than 1% at a thickness of 50 micrometers or even 0.5% at a thickness of 50 micrometers. Typically, optically clear articles have a visible light transmittance of at least 95%, often higher such as 97%, 98% or even 99% or higher. Optically clear adhesives or articles are generally color neutral on the CIE Lab scale, with the a orb values being less than 0.5.

Disclosed herein are barrier adhesive compositions. These barrier adhesive compositions comprise an isobutylene-based adhesive composition and a curable silsesquioxane additive. The isobutylene-based adhesive composition comprises at least one polyisobutylene-containing polymer, and may optionally include other components such as a tackifying resin. The curable silsesquioxane additive may be linear, caged, or branched. Typically the barrier adhesive compositions are pressure sensitive adhesives. In addition to barrier properties, and pressure sensitive adhesive properties, the barrier adhesive compositions may have additional desirable properties, such as desirable optical properties, and may be optically transparent or even optically clear.

The barrier adhesive composition comprises a majority of an isobutylene-based adhesive composition. By a majority, it is meant that the isobutylene-based adhesive composition comprises greater than 50% by weight of the total solids composition of the barrier adhesive composition. Typically, the isobutylene-based adhesive composition comprises much greater than 50% by weight of the total adhesive composition. As mentioned above, the isobutylene-based adhesive composition comprises at least one polyisobutylene-containing polymer, and may optionally include at least one tackifier. The at least one polyisobutylene-containing polymer may be a mixture of polyisobutylene-containing polymers. Examples of such mixtures include mixtures of polyisobutylene homopolymers, mixtures of a polyisobutylene homopolymers with polyisobutylene copolymers such as a butyl rubber polymers, and mixtures of polyisobutylene copolymers. The isobutylene-based adhesive composition is an adhesive composition on its own, meaning that it functions as an adhesive and has some level of barrier properties. This disclosure describes how these isobutylene-based adhesive compositions are improved by the addition of the curable silsesquioxane additives described below without compromising the desirable adhesive and barrier properties of the isobutylene-based adhesive compositions.

A wide variety of polyisobutylene-containing polymers are suitable. Among the particularly suitable polyisobutylene-containing polymers are polyisobutylene homopolymers and polyisobutylene copolymers. Among the particularly suitable polyisobutylene copolymers are butyl rubber polymers and styrene-isobutylene copolymers. Butyl rubber polymers are a class of synthetic rubber polymers that are copolymers of isobutylene and a wide range of co-monomers such as isoprene, styrene, n-butene or butadiene. Styrene-isobutylene copolymers are class of copolymers that include isobutylene and styrene.

The polyisobutylene-containing polymer generally has a viscosity average molecular weight of about 40,000 to about 2,600,000 g/mol. A wide variety of molecular weight polymers within this range are suitable including polymers with a viscosity average molecular weight of at least 40,000, at least 60,000, at least 80,000 or at least 100,000 g/mol or polymers with a viscosity average molecular weight of less than 2,600,000, less than 2,000,000, less than 1,000,000. In some embodiments the polyisobutylene-containing polymer generally has a viscosity average molecular weight of about 40,000 to about 1,000,000 g/mol, or 60,000 to about 900,000 g/mol, or 85,000 to about 800,000 g/mol. In some embodiments, the isobutylene-based adhesive composition comprises a blend of a first polyisobutylene-containing polymer having a viscosity average molecular weight of about 40,000 to about 800,000 g/mol, about 85,000 to about 500,000 g/mol, or about 85,000 to about 400,000 g/mol and a second polyisobutylene-containing polymer having a viscosity average molecular weight of about 40,000 to about 800,000 g/mol, about 85,000 to about 500,000 g/mol, or about 85,000 to about 400,000 g/mol. In some particular embodiments, the first polyisobutylene-containing polymer has a viscosity average molecular weight of about 400,000 g/mol and the second polyisobutylene-containing polymer has a viscosity average molecular weight of about 800,000 g/mol.

The polyisobutylene-containing polymers are generally resins having a polyisobutylene-containing polymer skeleton in the main or a side chain. In some embodiments, the polyisobutylene-containing polymers are substantially homopolymers of isobutylene such as, for example, polyisobutylene-containing polymers available under the tradenames of OPPANOL (BASF AG) and GLISSO-PAL (BASF AG). Examples of suitable commercially available polyisobutylene-containing polymers include OPPANOL B10 (Mv=40,000), OPPANOL B15 (Mv=85,000), OPPANOL B50 (Mv=400,000) and OPPANOL B80 (Mv=800,000). Another suitable commercially available polyisobutylene polymer is EFFROLEN P85 from Evramov. In some embodiments, the polyisobutylene-containing polymers comprise copolymers of isobutylene such as, for example, synthetic rubbers wherein isobutylene is copolymerized with another monomer. Synthetic rubbers include butyl rubbers which are copolymers of mostly isobutylene with a small amount of isoprene such as, for example, butyl rubbers available under the tradenames VISTANEX (Exxon Chemical Co.) and JSR BUTYL (Japan Butyl Co., Ltd.). Synthetic rubbers also include copolymers of mostly isobutylene with styrene, n-butene or butadiene. In some embodiments, a mixture of isobutylene homopolymer and butyl rubber may be used. For example, the first polyisobutylene-containing polymer can comprise a homopolymer of isobutylene and the second polyisobutylene can comprise butyl rubber, or the first polyisobutylene can comprise butyl rubber and the second polyisobutylene can comprise a homopolymer of isobutylene. The first and second polyisobutylene-containing polymers may each comprise more than one resin.

The polyisobutylene-containing polymers generally have a solubility parameter (SP value), which is an index for characterizing the polarity of a compound, that is similar to that of commonly used tackifying resins, such as for example, hydrogenated cycloaliphatic hydrocarbon resins, and exhibits good compatibility (i.e., miscibility) with these tackifying resins, if used, so that a transparent film can be formed. The optional tackifying resins are described in greater detail below. Furthermore, the polyisobutylene-containing polymers have low surface energy and therefore can enable spreadability of the adhesive onto an adherend and the generation of voids at the interface is minimized. In addition, the glass transition temperature and the moisture permeability are low and therefore, the polyisobutylene-containing polymers are suitable as the base resin of the adhesive encapsulating composition.

The polyisobutylene-containing polymers may have desirable viscoelastic properties that, in general, can be used to impart a desired degree of fluidity to the adhesive encapsulating composition. A strain rheometer may be used to determine elastic (storage) modulus, G', and viscous (loss) modulus, G", at various temperatures. G' and G" can then be used to determine the ratio $\tan(\delta)=G''/G'$. In general, the higher the $\tan(\delta)$ value, the more the material is like a viscous material, and the lower the $\tan(\delta)$ value, the more the material is like an elastic solid. In some embodiments, the polyisobutylene- containing polymer may be selected such that the adhesive encapsulating composition has a $\tan(\delta)$ value at relatively low frequency of at least about 0.5 when the composition is at temperatures of from about 70° C. to about 110° C. In this way, the composition is able to flow sufficiently over uneven surfaces with little or no air entrapment.

The barrier adhesive composition also comprises a curable silsesquioxane additive. A wide range of curable silsesquioxane additive types are suitable including linear, caged, and branched structures. Additionally, a wide range of organic groups may be present on the curable silsesquioxane additive. Among the particularly suitable organic groups are (meth)acrylate groups.

A silsesquioxane (SSQ) is a siloxane compound with the composition formula $[(RSiO_{1.5})_n]$, where its main chain backbone is composed of Si-O bonds. Its name indicates that it is a siloxane with a unit composition formula containing 1.5 oxygen atoms (1.5=sesqui) [Sil-sesqui-oxane]. As expressed by its composition $[(RSiO_{1.5})_n]$, SSQ can be considered as an interim substance between inorganic silicon $[SiO_2]$ (silica) and organic silicon $[(R_2SiO)_n]$ (a siloxane or silicone). In contrast to the insolubility of a completely inorganic material like silica, the organic groups of the SSQ permits it to dissolve in and form homogeneous blends with a range of organic materials. SSQ can take a number of different types of skeletal structures, including linear (sometimes called ladder) structures, cage structures, and branched structures which can be branched versions of either caged or linear structures. These different types of structures are shown below:

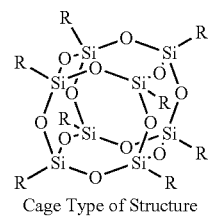

Cage Type of Structure

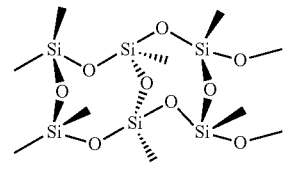

Linear or Ladder Type Structure

Among the caged structural types, POSS (polyhedral oligomeric silsesquioxane) are among the most common, and the structure shown above is an example of a POSS.

Silsesquioxanes have traditionally been synthesized by hydrolysis organotrichlorosilanes. An idealized synthesis is shown in Reaction Scheme A below:

$$8R^aSiCl_3+12H_2O \rightarrow [R^aSiO_{3/2}]_8+24HCl \qquad \text{Reaction Scheme A}$$

Depending on the $R^a$ substituent, the exterior of the cage can be further modified. Generally, $R^a$ is a hydrogen atom, an alkyl group, an aryl group, or an alkoxy group.

The silsesquioxanes of this disclosure are curable silsesquioxanes, meaning that they include curable groups that are free radically polymerizable. In some embodiments the curable silsesquioxanes are curable POSS materials, in other embodiments the curable silsesquioxanes are curable branched materials.

Examples of curable POSS materials include the commercially available POSS acrylate-functional POSS cage material MA0736 available from Hybrid Plastics, and the corresponding methacrylate-functional POSS cage material MA0735 also available from Hybrid Plastics. The structure for MA0736 is shown below.

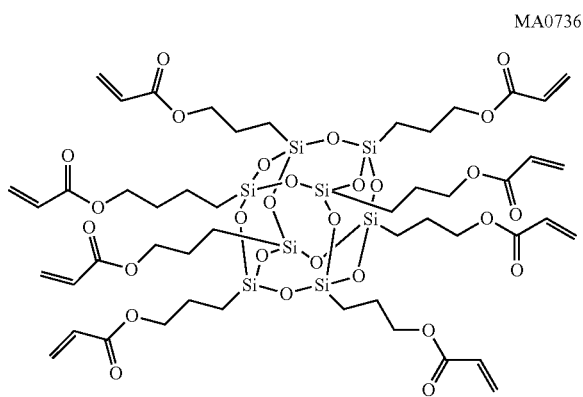 [SMILES: C=CC(=O)OCCCC[Si]12O[Si]3(CCCOC(=O)C=C)O[Si]4(CCCOC(=O)C=C)O[Si](CCCOC(=O)C=C)(O1)O[Si]1(CCCOC(=O)C=C)O[Si](CCCOC(=O)C=C)(O2)O[Si](CCCOC(=O)C=C)(O3)O[Si](CCCOC(=O)C=C)(O4)O1]

Also suitable are curable branched silsesquioxane network materials such as those described in PCT Publication No. WO 2015/088932 (Rathore et al.).

In some embodiments, the curable silsesquioxane polymer that includes a three-dimensional branched network having the formula:

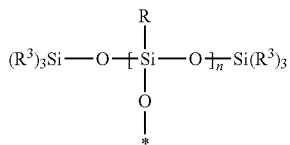

wherein the oxygen atom at the * is bonded to another Si atom within the three-dimensional branched network, R is an organic group comprising an ethylenically unsaturated group, and $R^3$ is independently a non-hydrolyzable group. In typical embodiments, $R^3$ is $C_1$-$C_{12}$ alkyl optionally comprising halogen substituents, aryl, or a combination thereof. In certain embodiments of the curable silsesquioxane polymer, R has the formula —Y—Z, as will subsequently be described.

In other embodiments, the curable silsesquioxane polymer that includes a three-dimensional branched network having the formula:

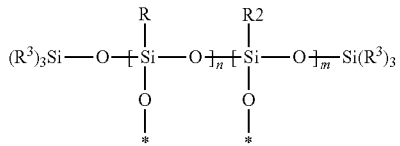

wherein the oxygen atom at the * is bonded to another Si atom within the three-dimensional branched network, R is an organic group comprising an ethylenically unsaturated group; R2 is an organic group that is not an ethylenically unsaturated group; $R^3$ is a non-hydrolyzable group; and n or n+m is an integer of greater than 3. In certain embodiments of the curable silsesquioxane polymer, R2 has the formula —Y—X, as will subsequently be described.

For embodiments wherein the curable silsesquioxane polymer is a copolymer comprising both n and m units, the sum of n+m is an integer of greater than 3. In certain embodiments, n+m is an integer of at least 10. In certain embodiments, n+m is an integer of no greater than 200. In certain embodiments, n+m is an integer of no greater than 175, 150, or 125. In some embodiments, n and m are selected such the copolymer comprises at least 25, 26, 27, 28, 29, or 30 mol % of repeat units comprising ethylenically unsaturated group(s) R. In some embodiments, n and m are selected such the copolymer comprises no greater than 85, 80, 75, 70, 65, or 60 mol % of repeat units comprising ethylenically unsaturated group(s) R.

In some embodiments, the curable silsesquioxane polymer that includes a three-dimensional branched network which is a reaction product of a compound having the formula Z—Y—Si($R^1$)$_3$. In this embodiment, R has the formula —Y—Z.

In other embodiments, the curable silsesquioxane copolymer that includes a three-dimensional branched network which is a reaction product of a compound having the formula Z—Y—Si($R^1$)$_3$ and a compound having the formula X—Y—Si($R^1$)$_3$. In this embodiment, R has the formula —Y—Z and R2 has the formula —Y—X.

The Y group is a (covalent) bond, or a divalent group selected from alkylene group, arylene, alkyarylene, and arylalkylene group. In certain embodiments, Y is a (C1-C20) alkylene group, a (C6-C12)arylene group, a (C6-C12)alk (C1-C20)arylene group, a (C6-C12)ar(C1-C20)alkylene group, or a combination thereof.

The group Z is an ethylenically unsaturated group selected from a vinyl group, a vinylether group, a (meth) acryloyloxy group, and a (meth)acryloylamino group (including embodiments wherein the nitrogen is optionally substituted with an alkyl such as methyl or ethyl). In certain embodiments, Z is a vinyl group.

The X group is hydrogen or a (monovalent) group selected from alkyl that is optionally halogenated, aryl, alkaryl, or a reactive group that is not an ethylenically unsaturated group. In some embodiments, X is an optionally halogenated (C1-C20)alkyl group such as (C4-C6) fluoroalkyl, a (C6-C12)aryl group, a (C6-C12)alk(C1-C20)aryl group, a (C6-C12)ar(C1-C20)alkyl group, a reactive group that is not an ethylenically unsaturated group, or a combination thereof. In some embodiments, X comprises an epoxide ring.

Curable silsesquioxane polymers can be made by hydrolysis and condensation of reactants of the formula Z—Y—Si($R^1$)$_3$. Examples of such reactants include vinyltriethoxysilane, allyltriethoxysilane, allylphenylpropyltriethoxysilane, 3-butenyltriethoxysilane, docosenyltriethoxysilane, and hexenyltriethoxysilane. Condensation of such reactants can be carried out using conventional techniques, as exemplified in the examples section. In some embodiments, the curable silsesquioxane polymers are made by the hydrolysis and condensation of reactants of the formula Z—Y—Si($R^1$)$_3$ and X—Y—Si ($R^1$)$_3$.

In each of the formulas Z—Y—Si($R^1$)$_3$ and X—Y—Si ($R^1$)$_3$, $R^1$ is independently a hydrolyzable group that is converted to a hydrolyzed group, such as —OH, during hydrolysis. After hydrolysis, the —OH groups are further reacted with an end-capping agent to convert the hydrolyzed group, e.g. —OH, to —OSi($R^3$)$_3$.

Various alkoxy silane end-capping agents are known. In some embodiments, the end-capping agent has the general structure $R^5$OSi($R^3$)$_3$ or O[Si($R^3$)$_3$]$_2$ wherein $R^5$ is a hydrolyzable group such as methoxy or ethoxy and $R^3$ is independently a non-hydrolyzable group. Thus, $R^3$ generally lacks an alkoxy group. $R^3$ is independently C1-C12 alkyl, aryl (e.g. phenyl), or combination thereof; that optionally comprises halogen substituents (e.g. chloro, bromo, fluoro). The optionally substituted alkyl group may have a straight, branched, or cyclic structure. In some embodiments, $R^3$ is C1-C4 alkyl optionally comprising halogen substituents.

One exemplary curable silsesquioxane polymer is poly(vinylsilsesquioxane) having the general formula:

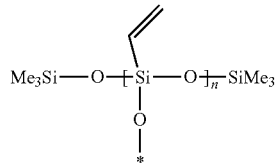

wherein the oxygen atom in the formula above at the * above is bonded to another Si atom within the three-dimensional branched network. Such three-dimensional branched network structure is depicted as follows:

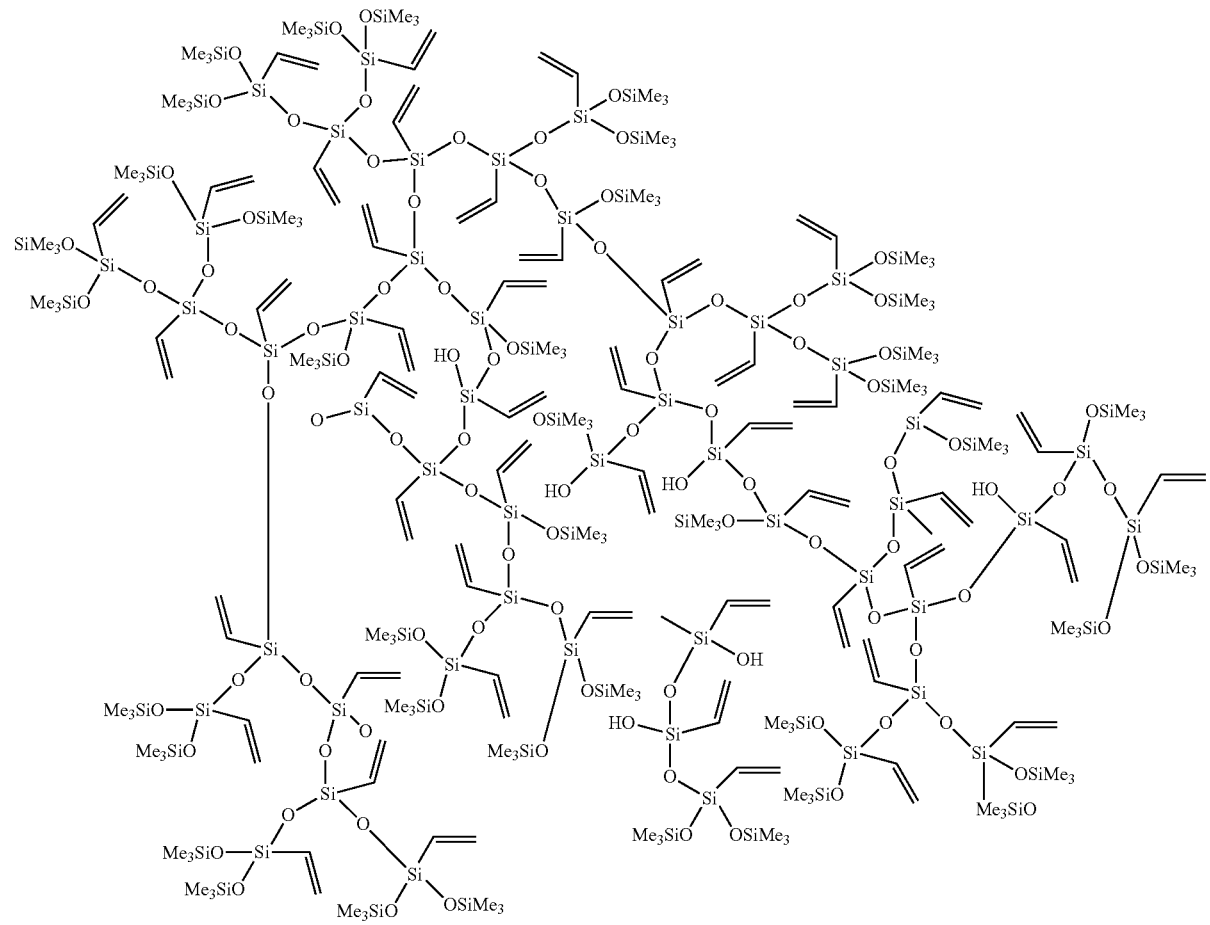

In other embodiments, curable silsesquioxane copolymers can be made with two or more reactants of the formula Z—Y—Si($R^1$)$_3$. For example, vinyltriethoxylsilane or allytriethoxysilane can be coreacted with an alkenylalkoxylsilane such as 3-butenyltriethoxysilane and hexenyltriethoxysilane. In this embodiment, the curable silsesquioxane polymers may comprise at least two different Z groups (e.g. Z' and Z"), yet the same Y groups. Alternatively, the curable silsesquioxane polymers may comprise at least two different Y groups (e.g. Y' and Y"), yet the same Z group (e.g. vinyl). Further, the curable silsesquioxane polymers may comprise at least two reactants wherein both Y and Z are different than each other. In such embodiment, R of the curable silsesquioxane polymer formulas is independently an organic group comprising an ethylenically unsaturated group (e.g. such as a vinyl group).

In yet other embodiments, curable silsesquioxane copolymers can be made with at least one reactant of the formula Z—Y—Si($R^1$)$_3$ and at least one reactant of the formula X—Y—Si($R^1$)$_3$. Examples of reactants of the formula X—Y—Si($R^1$)$_3$ include for example aromatic trialkoxysilanes such as phenyltrimethoxylsilane, C1-C12 alkyl trialkoxysilanes such as methyltrimethoxyl silane, fluoroalkyl trialkoxysilanes such as nonafluorohexyltriethoxysilane, and trialkoxysilanes comprising a reactive group that is not an ethylenically unsaturated group such as glycidoxypropyltriethoxysilane. The amount of reactant(s) of the formula Z—Y—Si($R^1$)$_3$ can range up to 100 mol % in the case of homopolymers. The copolymers typically comprise no greater than 99, 98, 97, 96, 95, 94, 93, 92, 91, or 90 mol % of reactant(s) of the formula Z—Y—Si($R^1$)$_3$. In some embodiments, the amount of reactant(s) of the formula Z—Y—Si($R^1$)$_3$ is no greater than 85, 80, 75, 70, or 60 mol %. In some embodiments, the amount of reactant(s) of the formula Z—Y—Si($R^1$)$_3$ is at least 15, 20, 25, or 30 mol %.

The amount of reactant(s) of the formula X—Y—Si($R^1$)$_3$ can be as little as 1, 2, 3, 4, 5, 6, 7, 8, 9, or 10 mol % of the copolymer. In some embodiments, the amount of reactant(s) of the formula X—Y—Si($R^1$)$_3$ is at least 15, 20, 25, or 30 mol %. The amount of reactant(s) of the formula X—Y—Si($R^1$)$_3$ is typically no greater than 75 mol % or 70 mol %. In some embodiments, the amount of reactant(s) of the formula X—Y—Si($R^1$)$_3$ is at least 15, 20, 25, or 30 mol %. In some embodiments, the amount of reactant(s) of the formula X—Y—Si($R^1$)$_3$ is no greater than 65 or 60 mol %. It is appreciated that the amount of reactants of the formula Z—Y—Si($R^1$)$_3$ or X—Y—Si($R^1$)$_3$ is equivalent to the amount of repeat units derived from Z—Y—Si($R^1$)$_3$ or X—Y—Si($R^1$)$_3$. In some embodiments the molar ratio of reactant(s) of the formula Z—Y—Si($R^1$)$_3$ to molar ratio to reactant(s) of the formula X—Y—Si($R^1$)$_3$ ranges from about 10:1; 15:1, or 10:1 to 1:4; or 1:3, or 1:2. Exemplary curable silsesquioxane copolymers have the general formula:

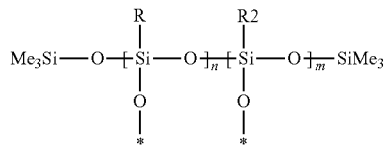

wherein the oxygen atom in the formula above at the * above is bonded to another Si atom within the three-dimensional branched network; R is a vinyl group; n is an integer of greater than 3; and R2 is hydrogen, phenyl, methyl, nonafluorohexyl, or glycidoxypropyl are depicted as follows:

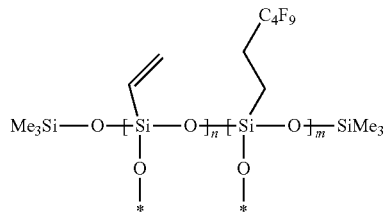

vinyl-co-nonafluorohexyl silsequioxane,

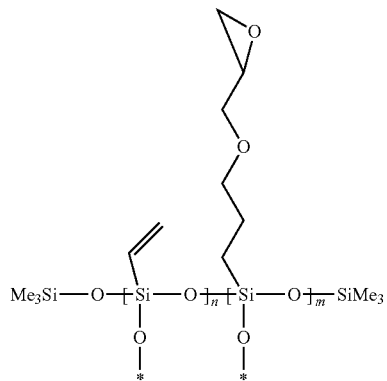

vinyl-co-glycidoxylpropyl silsesquioxane,

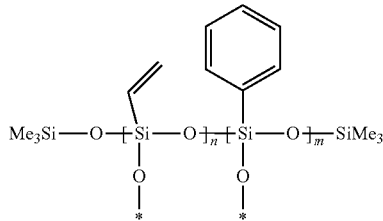

vinyl-co-phenyl silsesquioxane,

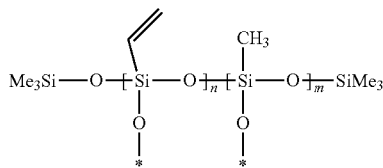

vinyl-co-methyl silsesquioxane, and

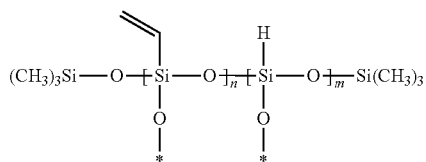

vinyl-co-hydro silsesquioxane.

The adhesive compositions of this disclosure may include additional optional components. These optional components are ones that are added in addition to the at least one isobutylene-containing polymer and the curable silsesquioxane additive. Suitable optional components are ones that do not adversely affect the properties of the adhesive compositions, such as the adhesive properties, the barrier properties or the optical properties.

The adhesive composition may also comprise at least one free radical initiator to cure the free radically polymerizable groups on the curable silsesquioxane polymers. In other embodiments, the curable silsesquioxane polymers can be cured without the use of an initiator by, for example, exposure to electron beam (e-beam) radiation.

If used, the initiator is generally a photoinitiator which is activated by ultraviolet (UV) radiation. Suitable free-radical photoinitiators can be selected from benzophenone, 4-methylbenzophenone, benzoyl benzoate, phenylacetophenones, 2,2-dimethoxy-2-phenylacetophenone, alpha,alpha-diethoxyacetophenone, 1-hydroxy-cyclohexyl-phenyl-ketone (available under the trade designation IRGACURE 184 from BASF Corp., Florham Park, N.J.), 2-hydroxy-2-methyl-1-phenylpropan-1-one, bis-(2,6-dimethoxybenzoyl)-2,4,4-trimethylpentyl phosphine oxide, 2-hydroxy-2-methyl-1-phenylpropan-1-one, 2-hydroxy-2-methyl-1-phenylpropan-1-one (available under the trade designation DAROCURE 1173 from BASF Corp.), 2,4,6-trimethylbenzoyl-diphenylphosphine oxide, and combinations thereof (e.g., a 50:50 by wt. mixture of 2,4,6-trimethylbenzoyl-diphenylphosphine oxide and 2-hydroxy-2-methyl-1-phenylpropan-1-one, available under the trade designation DAROCURE 4265 from BASF Corp.).

A photoinitiator is typically present in adhesive composition in an amount of at least 0.01 percent by weight (wt-%), based on the total weight of curable material in the coating composition. A photoinitiator is typically present in a coating composition in an amount of no greater than 5 wt-%, based on the total weight of curable material in the coating composition.

Another particularly suitable optional additive is a tackifying resin, also sometimes called a tackifier. In general, a tackifier can be any compound or mixture of compounds that increases the tackiness of the adhesive encapsulating composition. Desirably, the tackifier does not increase moisture permeability. The tackifier may comprise a hydrogenated hydrocarbon resin, a partially hydrogenated hydrocarbon resin, a non-hydrogenated hydrocarbon resin, or a combination thereof. Typically, the tackifier comprises a hydrogenated petroleum resin. In some embodiments, the resin system comprises about 15 to about 35 wt. %, about 20 to about 30 wt. %, or about 25 wt. %, of the tackifer relative to the total weight of the resin system.

Examples of tackifiers include, but are not limited to, hydrogenated terpene-based resins (for example, resins commercially available under the trade designation CLEARON P, M and K (Yasuhara Chemical)); hydrogenated resins or hydrogenated ester-based resins (for example, resins commercially available under the trade designation FORAL AX (Hercules Inc.); FORAL 105 (Hercules Inc.); PENCEL A (Arakawa Chemical Industries. Co., Ltd.); ESTERGUM H (Arakawa Chemical Industries Co., Ltd.); and SUPER ESTER A (Arakawa Chemical Industries. Co., Ltd.); disproportionate resins or disproportionate ester-based resins (for example, resins commercially available under the trade designation PINECRYSTAL (Arakawa Chemical Industries Co., Ltd.); hydrogenated dicyclopentadiene-based resins which are hydrogenated resins of a C5-type petroleum resin obtained by copolymerizing a C5 fraction such as pentene, isoprene, piperine and 1,3-pentadiene produced through thermal decomposition of petroleum naphtha (for example, resins commercially available under the trade designations ESCOREZ 5300 and 5400 series (Exxon Chemical Co.); EASTOTAC H (Eastman Chemical Co.)); partially hydrogenated aromatic modified dicyclopentadiene-based resins (for example, resins commercially available under the trade designation ESCOREZ 5600 (Exxon Chemical Co.)); resins resulting from hydrogenation of a C9-type petroleum resin obtained by copolymerizing a C9 fraction such as indene, vinyltoluene and α- or β-methylstyrene produced by thermal decomposition of petroleum naphtha (for example, resins commercially available under the trade designation ARCON P or ARCON M (Arakawa Chemical Industries Co., Ltd.)); resins resulting from hydrogenation of a copolymerized petroleum resin of the above-described C5 fraction and C9 fraction (for example, resin commercially available under the trade designation IMARV (Idemitsu Petrochemical Co.)).

Non-hydrogenated hydrocarbon resins include C5, C9, C5/C9 hydrocarbon resins, polyterpene resins, aromatics-modified polyterpene resins or rosin derivatives. If a non-hydrogenated hydrocarbon resin is used, it is typically used in combination with another hydrogenated or partially hydrogenated tackifier.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mol. In another embodiment, the weight average molecular weight of the hydrogenated cycloaliphatic hydrocarbon resin is from about 500 to 3,000 g/mol. If the weight average molecular weight exceeds 5,000 g/mol, poor tackification may result or the compatibility with the polyisobutylene-containing polymer may decrease.

The tackifier may have a softening temperature or point (ring and ball softening temperature) that may vary, depending at least in part, upon the adhesion of the composition, the temperature utilized, the ease of production, and the like. The ring and ball softening temperature can generally be from about 50 to 200° C. In some embodiments, the ring and ball softening temperature is from about 80 to 150° C. If the ring and ball softening temperature is less than 80° C., the tackifier may undergo separation and liquefaction due to heat generated upon the emission of light by the electronic device. This can cause deterioration of an organic layer such as a light-emitting layer when an organic electroluminescent device is encapsulated directly with an adhesive encapsulating composition. On the other hand, if the ring and ball softening point exceeds 150° C., the amount of tackifier added is so low that satisfactory improvement of relevant characteristics may not be obtained.

In some embodiments, the tackifier comprises a hydrogenated hydrocarbon resin, and particularly, a hydrogenated cycloaliphatic hydrocarbon resin. A specific example of a hydrogenated cycloaliphatic hydrocarbon resin includes ESCOREZ 5340 (Exxon Chemical). In some embodiments, the hydrogenated cycloaliphatic hydrocarbon resin is a hydrogenated dicyclopentadiene-based resin because of its low moisture permeability and transparency. Hydrogenated cycloaliphatic hydrocarbon resins that can be utilized in the adhesive encapsulating compositions typically have a weight average molecular weight from about 200 to 5,000 g/mol. In another embodiment, the weight average molecular weight of the hydrogenated cycloaliphatic hydrocarbon resin is from about 500 to 3,000 g/mol. If the weight average molecular weight exceeds 5,000 g/mol, poor tackification may result or the compatibility with the polyisobutylene-containing polymer may decrease.

As mentioned above, the barrier adhesive compositions of this disclosure comprise at least one isobutylene-containing polymer and a curable silsesquioxane additive, and may optionally include one or more additives such as a tackifying resin. To form an adhesive layer, the desired components of one or more isobutylene-containing polymers, a curable silsesquioxane additive and optional tackifying resin can be mixed together in any suitable way including solvent-based mixtures and solventless mixtures. In some embodiments, the barrier adhesive components are dissolved in a suitable solvent and mixed. This mixture can then be coated onto a film substrate or a release liner and dried to remove the solvent to generate a layer of barrier adhesive. In other embodiments, the components can be hot melt mixed either in a hot melt mixer or an extruder to form a molten mixture which can then be coated onto a film substrate or release liner and permitted to cool to generate a layer of barrier adhesive.

When solvents are used, any suitable solvent capable of dissolving the mixture components may be used. Examples of suitable solvents are hydrocarbon solvents including: aromatic solvents such as benzene, toluene, and xylenes; and aliphatic solvents such as heptane, iso-octane, and cyclohexane.

Typically the barrier adhesive composition comprises a majority of isobutylene-containing polymer and optional tackifying resin and a minority of the curable silsesquioxane additive. In some embodiments, the barrier adhesive composition comprises 0.1-30 weight % of curable silsesquioxane additive based upon the total weight of solids of the barrier adhesive composition. The total weight of solids of the barrier adhesive composition is the total weight of the solid components present in the mixture and does not include the volatile components such as solvent. More typically, the barrier adhesive composition comprises 0.1-25 wt % of curable silsesquioxane additive, or even 1.0-25 wt % of curable silsesquioxane additive. In some embodiments the barrier adhesive composition comprises at least 0.1, 0.2, 0.5, or even 1.0 wt % of curable silsesquioxane additive. In other embodiments, the barrier adhesive composition comprises no more than 30, 25, 20, 15, 12, or even 10 wt % of the curable silsesquioxane additive.

The barrier adhesive compositions can be mixed and used, and typically the coated and dried adhesive compositions is cured, to cure the curable silsesquioxane polymers. The term curing as used herein refers to polymerization of reactive compounds, and is not synonymous with crosslinking. While curing may involve the generation of crosslinks, crosslinks need not necessarily be formed. Typically actinic radiation or an electron beam is applied to the adhesive composition to initiate curing. If an electron beam is used, no initiator is necessary in the adhesive composition, rather the electron beam generates free radicals within the polymer chains which can then react to carry out the curing reaction. If actinic radiation is used, such as ultraviolet (UV) radiation, typically an initiator is included in the adhesive composition that is sensitive to the actinic radiation, as was described above.

Also disclosed herein are barrier adhesive compositions that comprise at least one isobutylene-containing polymer and a cured silsesquioxane additive, where the cured silsesquioxane additive is a curable silsesquioxane additive as described above that has been cured.

The barrier adhesive compositions described above are used to prepare barrier film article constructions. These article constructions comprise a layer of barrier adhesive and a barrier film substrate. In some embodiments, the barrier film article construction comprises a barrier film with a first major surface and a second major surface, and a pressure sensitive adhesive layer with a first major surface and a second major surface, where the second major surface of the pressure sensitive adhesive layer is in contact with the first major surface of the barrier film. The pressure sensitive adhesive layer compositions have been described in detail above, and comprise a polyisobutylene-containing polymer and a cured or curable silsesquioxane additive.

The barrier adhesive layer is formed from the barrier adhesive compositions described above that have been coated and dried if the adhesive compositions are solvent borne, and cured. As described above, the adhesive compositions comprise a polyisobutylene-containing polymer and a cured or curable silsesquioxane additive. The adhesive compositions may also comprise one more additional additives such as an initiator and/or a tackifying resin. It should be noted that the barrier adhesive composition, if curable, upon curing is still a pressure sensitive adhesive. The barrier adhesive is not a set adhesive that upon curing is permanently bonded and is no longer a pressure sensitive adhesive.

The barrier adhesive compositions can be applied to a substrate, a device or any device components by any useful coating process. Solvent based drying adhesives are typically applied by brush, roller, bead or ribbon, or spray. The barrier adhesive composition can be coated onto an appropriate substrate to form a barrier adhesive article.

The barrier adhesive composition can, for example, be coated onto a barrier film and allowed to dry to form an adhesive barrier film construction. Alternatively, the barrier adhesive composition can be coated onto a release liner and allowed to dry to form a free standing adhesive layer. Such free standing adhesive layers are sometimes referred to as transfer tapes, as the free standing adhesive layer is able to be transferred to a substrate surface. The free standing adhesive layer can then be laminated to a film or the surface of a device to form an article. The release liner can then be removed to expose an adhesive surface to which can be laminated another substrate surface.

The barrier adhesive layers can have a wide range of thicknesses, depending upon the desired use of the barrier adhesive layer. Since the barrier adhesive layer is functioning as a barrier it typically has sufficient thickness to achieve barrier properties, without being so thick that adhesive layer is cumbersome or adversely affects the properties, such as flexibility, of the articles to which it is incorporated. In some embodiments the barrier adhesive layer is at least 5 micrometers thick, up to a thickness of no more than 50 micrometers. Typically, the barrier adhesive layer has a thickness of from 10-25 micrometers.

The barrier adhesive layers exhibit a wide range of desirable properties, beyond adhesive properties. Among the properties are of course their barrier properties, by which it is meant their ability to stop or hinder the transport of moisture and oxygen. In many embodiments, the barrier adhesive layers also have desirable optical properties and may be optically transparent or even optically clear, which mean that the barrier adhesive layers have good visible light transmittance and low haze. In some embodiments, the barrier adhesive composition has a visible light transmittance of about 90% or greater. In some embodiments, the barrier adhesive composition has a haze of about 3% or less, or about 2% or less.

Examples of polymeric gas-barrier films include ethyl vinyl alcohol copolymer (EVOH) films such as polyethylene EVOH films and polypropylene EVOH films; polyamide films such as coextruded polyamide/polyethylene films, coextruded polypropylene/polyamide/polypropylene films; and polyethylene films such as low density, medium density or high density polyethylene films and coextruded polyethylene/ethyl vinyl acetate films. Polymeric gas-barrier films can also be metallized, for example, coating a thin layer of metal such as aluminum on the polymer film.

Examples of inorganic gas-barrier films include films comprising silicon oxide, silicon nitride, silicon oxynitride, aluminum oxide, diamond-like films, diamond-like glass and foils such as aluminum foil.

Generally, the gas-barrier film is flexible. For some applications, it is also desirable that the gas-barrier film be visible light-transmissive. As used herein, the term "visible light-transmissive" means having an average transmission over the visible portion of the spectrum (for example, between 400 nm and 700 nm) of at least about 80%, more typically at least about 88% or 90%.

For some applications, protection from moisture and oxygen is required. For particularly sensitive applications an "ultra-barrier film" may be necessary. Ultra-barrier films typically have an oxygen transmission rate less than about 0.005 cc/$m^2$/day at 23° C. and 90% RH and a water vapor transmission rate of less than about 0.005 g/m2/day at 23° C. and 90% RH. Surprisingly, it has been discovered that there is a substantial improvement in the barrier performance of ultra-barrier films when they are coated with the barrier adhesive compositions of this disclosure.

Some ultra-barrier films are multilayer films comprising an inorganic visible light-transmissive layer disposed between polymer layers. One example of a suitable ultra-barrier film comprises a visible light-transmissive inorganic barrier layer disposed between polymers having a glass transition temperature (Tg) greater than or equal to that of heat-stabilized polyethylene terephthalate (HSPET).

A variety of polymers having a Tg greater than or equal to that of HSPET can be employed. Volatilizable monomers that form suitably high Tg polymers are especially desirable. Generally the first polymer layer has a Tg greater than that of PMMA, more typically a Tg of at least about 110° C., or at least about 150° C., or even at least about 200° C. Especially suitable monomers that can be used to form the first layer include urethane acrylates (e.g., CN-968, Tg=about 84° C. and CN-983, Tg=about 90° C., both commercially available from Sartomer Co.), isobornyl acrylate (e.g., SR-506, commercially available from Sartomer Co., Tg=about 88° C.), dipentaerythritol pentaacrylates (e.g., SR-399, commercially available from Sartomer Co., Tg=about 90° C.), epoxy acrylates blended with styrene (e.g., CN-120580, commercially available from Sartomer Co., Tg=about 95° C.), di-trimethylolpropane tetraacrylates (e.g., SR-355, commercially available from Sartomer Co., Tg=about 98° C.), diethylene glycol diacrylates (e.g., SR-230, commercially available from Sartomer Co., Tg=about 100° C.), 1,3-butylene glycol diacrylate (e.g., SR-212, commercially available from Sartomer Co., Tg=about 101° C.), pentaacrylate esters (e.g., SR-9041, commercially available from Sartomer Co., Tg=about 102° C.), pentaerythritol tetraacrylates (e.g., SR-295, commercially available from Sartomer Co., Tg=about 103° C.), pentaerythritol triacrylates (e.g., SR-444, commercially available from Sartomer Co., Tg=about 103° C.), ethoxylated (3) trimethylolpropane triacrylates (e.g., SR-454, commercially available from Sartomer Co., Tg=about 103° C.), ethoxylated (3) trimethylolpropane triacrylates (e.g., SR-454HP, commercially available from Sartomer Co., Tg=about 103° C.), alkoxylated trifunctional acrylate esters (e.g., SR-9008, commercially available from Sartomer Co., Tg=about 103° C.), dipropylene glycol diacrylates (e.g., SR-508, commercially available from Sartomer Co., Tg=about 104° C.), neopentyl glycol diacrylates (e.g., SR-247, commercially available from Sartomer Co., Tg=about 107° C.), ethoxylated (4) bisphenol a dimethacrylates (e.g., CD-450, commercially available from Sartomer Co., Tg=about 108° C.), cyclohexane dimethanol diacrylate esters (e.g., CD-406, commercially available from Sartomer Co., Tg=about 110° C.), isobornyl methacrylate (e.g., SR-423, commercially available from Sartomer Co., Tg=about 110° C.), cyclic diacrylates (e.g., SR-833, commercially available from Sartomer Co., Tg=about 186° C.) and tris (2-hydroxy ethyl) isocyanurate triacrylate (e.g., SR-368, commercially available from Sartomer Co., Tg=about 272° C.), acrylates of the foregoing methacrylates and methacrylates of the foregoing acrylates.

The first polymer layer can be formed by applying a layer of a monomer or oligomer to the substrate and crosslinking the layer to form the polymer in situ, e.g., by flash evaporation and vapor deposition of a radiation-crosslinkable monomer, followed by crosslinking using, for example, an electron beam apparatus, UV light source, electrical discharge apparatus or other suitable device. Coating efficiency can be improved by cooling the support. The monomer or oligomer can also be applied to the substrate using conventional coating methods such as roll coating (e.g., gravure roll coating) or spray coating (e.g., electrostatic spray coating), then crosslinked as set out above. The first polymer layer can also be formed by applying a layer containing an oligomer or polymer in solvent and drying the thus-applied layer to remove the solvent. Plasma polymerization may also be employed if it will provide a polymeric layer having a glassy state at an elevated temperature, with a glass transition temperature greater than or equal to that of HSPET. Most desirably, the first polymer layer is formed by flash evaporation and vapor deposition followed by crosslinking in situ, e.g., as described in U.S. Pat. No. 4,696,719 (Bischoff), U.S. Pat. No. 4,722,515 (Ham), U.S. Pat. No. 4,842,893 (Yializis et al.), U.S. Pat. No. 4,954,371 (Yializis), U.S. Pat. No. 5,018,048 (Shaw et al.), U.S. Pat. No. 5,032,461 (Shaw et al.), U.S. Pat. No. 5,097,800 (Shaw et al.), U.S. Pat. No. 5,125,138 (Shaw et al.), U.S. Pat. No. 5,440,446 (Shaw et al.), U.S. Pat. No. 5,547,908 (Furuzawa et al.), U.S. Pat. No. 6,045,864 (Lyons et al.), U.S. Pat. No. 6,231,939 (Shaw et al.) and U.S. Pat. No. 6,214,422 (Yializis); in published PCT Application No. WO 00/26973 (Delta V Technologies, Inc.); in D. G. Shaw and M. G. Langlois, "A New Vapor Deposition Process for Coating Paper and Polymer Webs", 6th International Vacuum Coating Conference (1992); in D. G. Shaw and M. G. Langlois, "A New High Speed Process for Vapor Depositing Acrylate Thin Films: An Update", Society of Vacuum Coaters 36th Annual Technical Conference Proceedings (1993); in D. G. Shaw and M. G. Langlois, "Use of Vapor Deposited Acrylate Coatings to Improve the Barrier Properties of Metallized Film", Society of Vacuum Coaters 37th Annual Technical Conference Proceedings (1994); in D. G. Shaw, M. Roehrig, M. G. Langlois and C. Sheehan, "Use of Evaporated Acrylate Coatings to Smooth the Surface of Polyester and Polypropylene Film Substrates", RadTech (1996); in J. Affinito, P. Martin, M. Gross, C. Coronado and E. Greenwell, "Vacuum deposited polymer/metal multilayer films for optical application", Thin Solid Films 270, 43-48 (1995); and in J. D. Affinito, M. E. Gross, C. A. Coronado, G. L. Graff, E. N. Greenwell and P. M. Martin, "Polymer-Oxide Transparent Barrier Layers", Society of Vacuum Coaters 39th Annual Technical Conference Proceedings (1996).

The smoothness and continuity of each polymer layer and its adhesion to the underlying layer generally is enhanced by appropriate pretreatment. A suitable pretreatment regimen employs an electrical discharge in the presence of a suitable reactive or non-reactive atmosphere (e.g., plasma, glow discharge, corona discharge, dielectric barrier discharge or atmospheric pressure discharge); chemical pretreatment or flame pretreatment. These pretreatments help make the surface of the underlying layer more receptive to formation of the subsequently applied polymeric layer. Plasma pretreatment is particularly suitable. A separate adhesion promotion layer which may have a different composition than the high Tg polymer layer may also be utilized atop an underlying layer to improve interlayer adhesion. The adhesion promotion layer can be, for example, a separate polymeric layer or a metal-containing layer such as a layer of metal, metal oxide, metal nitride or metal oxynitride. The adhesion promotion layer may have a thickness of a few nm (e.g., 1 or 2 nm) to about 50 nm, and can be thicker if desired.

The desired chemical composition and thickness of the first polymer layer will depend in part on the nature and surface topography of the support. The thickness generally is sufficient to provide a smooth, defect-free surface to which the subsequent first inorganic barrier layer can be applied. For example, the first polymer layer may have a thickness of a few nm (e.g., 2 or 3 nanometers) to about 5 micrometers, and can be thicker if desired.

One or more visible light-transmissive inorganic barrier layers separated by a polymer layer having a Tg greater than or equal to that of HSPET lie atop the first polymer layer. These layers can respectively be referred to as the "first inorganic barrier layer", "second inorganic barrier layer" and "second polymer layer". Additional inorganic barrier layers and polymer layers can be present if desired, including polymer layers that do not have a Tg greater than or equal to that of HSPET. Typically however each neighboring pair of inorganic barrier layers is separated only by a polymer layer or layers having a Tg greater than or equal to that of HSPET, and more desirably only by a polymer layer or layers having a Tg greater than that of PMMA.

The inorganic barrier layers do not have to be the same. A variety of inorganic barrier materials can be employed. Suitable inorganic barrier materials include metal oxides, metal nitrides, metal carbides, metal oxynitrides, metal oxyborides, and combinations thereof, e.g., silicon oxides such as silica, aluminum oxides such as alumina, titanium oxides such as titania, indium oxides, tin oxides, indium tin oxide ("ITO"), tantalum oxide, zirconium oxide, niobium oxide, boron carbide, tungsten carbide, silicon carbide, aluminum nitride, silicon nitride, boron nitride, aluminum oxynitride, silicon oxynitride, boron oxynitride, zirconium oxyboride, titanium oxyboride, and combinations thereof. Indium tin oxide, silicon oxide, aluminum oxide and combinations thereof are especially desirable inorganic barrier materials. ITO is an example of a special class of ceramic materials that can become electrically conducting with the proper selection of the relative proportions of each elemental constituent. The inorganic barrier layers generally are formed using techniques employed in the film metallizing art such as sputtering (e.g., cathode or planar magnetron sputtering), evaporation (e.g., resistive or electron beam evaporation), chemical vapor deposition, atomic layer deposition, plating and the like. More generally the inorganic barrier layers are formed using sputtering, e.g., reactive sputtering. Enhanced barrier properties have been observed when the inorganic layer is formed by a high energy deposition technique such as sputtering compared to lower energy techniques such as conventional chemical vapor deposition processes. The smoothness and continuity of each inorganic barrier layer and its adhesion to the underlying layer can be enhanced by pretreatments (e.g., plasma pretreatment) such as those described above with reference to the first polymer layer.

The inorganic barrier layers do not have to have the same thickness. The desired chemical composition and thickness of each inorganic barrier layer will depend in part on the nature and surface topography of the underlying layer and on the desired optical properties for the barrier assembly. The inorganic barrier layers suitably are sufficiently thick so as to be continuous, and sufficiently thin so as to ensure that the barrier assembly and articles containing the assembly will have the desired degree of visible light transmission and flexibility. Generally the physical thickness (as opposed to the optical thickness) of each inorganic barrier layer is about 3 to about 150 nm, more typically about 4 to about 75 nm.

The second polymer layers that separate the first, second and any additional inorganic barrier layers do not have to be the same, and do not all have to have the same thickness. A variety of second polymer layer materials can be employed. Suitable second polymer layer materials include those mentioned above with respect to the first polymer layer. Generally the second polymer layer or layers are applied by flash evaporation and vapor deposition followed by crosslinking in situ as described above with respect to the first polymer layer. A pretreatment such as those described above (e.g., plasma pretreatment) frequently also is employed prior to formation of a second polymer layer. The desired chemical composition and thickness of the second polymer layer or layers will depend in part on the nature and surface topography of the underlying layer(s). The second polymer layer thickness generally is sufficient to provide a smooth, defect-free surface to which a subsequent inorganic barrier layer can be applied. Typically the second polymer layer or layers may have a lower thickness than the first polymer layer. For example, each second polymer layer may have a thickness of about 5 nanometers to about 10 micrometers, and can be thicker if desired.

Flexible visible light-transmissive ultra-barrier films and their manufacture are described, for example, in U.S. Pat. No. 7,940,004 (Padiyath et al.).

Commercially available ultra-barrier films include, for example, FTB 3-50 and FTB 3-125 available from 3M Company.

The barrier adhesive articles of the present disclosure may also include a releasing substrate in contact with the barrier adhesive layer. A wide variety of releasing substrates are suitable. Typically the releasing substrate is a release liner or other film from which the adhesive layer can be readily removed. Exemplary release liners include those prepared from paper (e.g., Kraft paper) or polymeric material (e.g., polyolefins such as polyethylene or polypropylene, ethylene vinyl acetate, polyurethanes, polyesters such as polyethylene terephthalate, and the like, and combinations thereof). At least some release liners are coated with a layer of a release agent such as a silicone-containing material or a fluorocarbon-containing material. Exemplary release liners include, but are not limited to, liners commercially available from CP Film (Martinsville, Va.) under the trade designation "T-30" and "T-10" that have a silicone release coating on polyethylene terephthalate film.

The releasing substrate may comprise a structured surface, such that when the structured surface is in contact with the adhesive layer it can impart a structured surface to the adhesive layer.

A wide range of release liners with a structured pattern present on its surface (frequently called microstructured release liners) are suitable. Typically the microstructured release liners are prepared by embossing. This means that the release liner has an embossable surface which is contacted to a structured tool with the application of pressure and/or heat to form an embossed surface. This embossed surface is a structured surface. The structure on the embossed surface is the inverse of the structure on the tool surface, that is to say a protrusion on the tool surface will form a depression on the embossed surface, and a depression on the tool surface will form a protrusion on the embossed surface. Typically structured release liners are used to prepare adhesive surfaces with patterns that allow air egress so that air does not become entrapped during lamination. However, as mentioned above, typically polyisobutylene-based adhesive layers do not trap air, and therefore the use of structured release liners is not necessary.

Releasing substrates are frequently used with adhesive layers to protect the adhesive layer until used, at which point the releasing substrate is removed to expose the adhesive surface. In some embodiments the releasing substrate is contacted to the barrier adhesive layer that is in contact with the barrier film substrate to form a construction comprising releasing substrate/barrier adhesive/barrier film.

In other embodiments, the releasing substrate can function as a carrier layer. In these embodiments the adhesive layer composition, or a precursor composition (such as for example a solution or dispersion that contains the adhesive layer composition or a curable composition that upon curing forms the adhesive layer composition) can be contacted to the releasing substrate. The coated composition can be dried, cured or otherwise processed as desired and the thus formed adhesive layer can then be contacted to the barrier film substrate to form the barrier film article. In these embodiments, the formed articles are also constructions comprising releasing substrate/barrier adhesive/barrier film.

Also disclosed herein are devices that include the barrier film articles disclosed above. In a general sense these devices are described as encapsulated organic electronic devices. These encapsulated organic electronic device comprise a device substrate, an organic electronic device disposed on the device substrate, and a barrier film article disposed on the organic electronic device and at least a portion of the device substrate, such that the pressure sensitive adhesive layer of the barrier film article and the device substrate encapsulate the organic electronic device.

The device substrate is typically flexible and visible light-transmissive. Suitable substrate materials include organic polymeric materials such as polyethylene terephthalate (PET), polyacrylates, polycarbonate, silicone, epoxy resins, silicone-functionalized epoxy resins, polyester such as MYLAR (made by E. I. du Pont de Nemours & Co.), polyimide such as KAPTON H or KAPTON E (made by du Pont), APICAL AV (made by Kanegafugi Chemical Industry Company), UPILEX (made by UBE Industries, Ltd.), polyethersulfones (PES, made by Sumitomo), polyetherimide, polyethylenenaphthalene (PEN), polymethyl methacrylate, styrene/acrylonitrile, styrene/maleic anhydride, polyoxymethylene, polyvinylnaphthalene, polyetheretherketon, polyaryletherketone, high Tg fluoropolymers (for example, DYNEON HTE terpolymer of hexafluoropropylene, tetrafluoroethylene, and ethylene), poly α-methyl styrene, polyarylate, polysulfone, polyphenylene oxide, polyamideimide, polyimide, polyphthalamide, polyethylene, and polypropylene. Colorless polyimide, cyclic olefin copolymer and cyclic olefin copolymer can also be utilized. Frequently the substrate comprises PET.

A wide range of organic electronic devices are suitable as the devices of this disclosure. The barrier film constructions of this disclosure can be used for protection from oxygen and moisture in OLED displays and solid state lighting, solar cells, electrophoretic and electrochromic displays, thin film batteries, quantum dot devices, sensor and other organic electronic devices. They are especially well-suited for applications that require oxygen and moisture protection as well flexibility and good optical transmittance.

The barrier adhesive layers, barrier film constructions, and devices including barrier film constructions of this disclosure are further illustrated in the Figures.

FIG. 1 illustrates article 100, which is a barrier film construction. The barrier film construction comprises barrier adhesive layer 120, barrier film 110, and release substrate 130.

Figure 2:
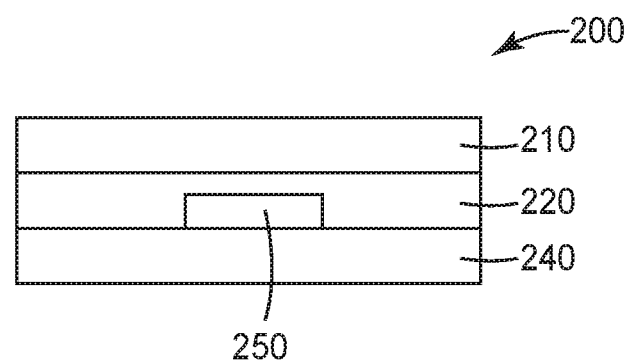
FIG. 2 shows a cross-sectional view of an embodiment of a device of this disclosure.

FIG. 2 illustrates device 200, which is an organic electronic device, such as an OLED device, that includes a barrier film construction. In FIG. 2, the organic electronic device 250 is disposed on device substrate 240. Organic electronic device 250 is encapsulated with a barrier film construction that includes barrier film 210 and barrier adhesive layer 220.

This disclosure includes the following embodiments:

Among the embodiments are barrier adhesive compositions. Embodiment 1 is a barrier adhesive composition comprising: at least one polyisobutylene-containing polymer; and a curable silsesquioxane additive.

Embodiment 2 is the barrier adhesive composition of embodiment 1, wherein the barrier adhesive composition is optically transparent.

Embodiment 3 is the barrier adhesive composition of embodiment 1, wherein the barrier adhesive composition is optically clear.

Embodiment 4 is the barrier adhesive composition of any of embodiments 1-3, wherein the curable silsesquioxane additive is a cage silsesquioxane, a linear silsesquioxane, or a branched silsesquioxane.

Embodiment 5 is the barrier adhesive composition of any of embodiments 1-4, wherein the curable silsesquioxane additive is a polyhedral oligomeric silsesquioxane.

Embodiment 6 is the barrier adhesive composition of any of embodiments 1-5, wherein the curable silsesquioxane additive is ethylenically unsaturated.

Embodiment 7 is the barrier adhesive composition of any of embodiments 1-6, wherein the curable silsesquioxane additive is (meth)acrylate-functional.

Embodiment 8 is the barrier adhesive composition of any of embodiments 1-7, wherein the barrier adhesive composition comprises at least one polyisobutylene-containing polymer having a viscosity average molecular weight of 40,000 to 2,600,000 grams/mole.

Embodiment 9 is the barrier adhesive composition of any of embodiments 1-8, wherein the barrier adhesive composition comprises at least one polyisobutylene-containing polymer having a viscosity average molecular weight of 40,000 to 1,000,000 g/mole.

Embodiment 10 is the barrier adhesive composition of any of embodiments 1-9, wherein the barrier adhesive composition comprises at least one polyisobutylene-containing polymer having a viscosity average molecular weight of 60,000 to 900,000 g/mole.

Embodiment 11 is the barrier adhesive composition of any of embodiments 1-10, wherein the barrier adhesive composition comprises at least one polyisobutylene-containing polymer having a viscosity average molecular weight of 85,000 to 800,000 g/mole.

Embodiment 12 is the barrier adhesive composition of any of embodiments 1-11, wherein the at least one polyisobutylene-containing polymer comprises a polyisobutylene polymer, a styrene-isobutylene copolymer, a butyl rubber polymer, or a combination thereof.

Embodiment 13 is the barrier adhesive composition of any of embodiments 1-12, wherein the at least one polyisobutylene-containing polymer comprises a mixture of two polyisobutylene polymers.

Embodiment 14 is the barrier adhesive composition of any of embodiments 1-13, wherein the adhesive composition further comprises at least one tackifying resin.

Embodiment 15 is the barrier adhesive composition of any of embodiments 1-14, wherein the barrier adhesive comprises 0.1-30 weight % of curable silsesquioxane additive.

Embodiment 16 is the barrier adhesive composition of any of embodiments 1-14, wherein the barrier adhesive comprises 0.2-20 weight % of curable silsesquioxane additive.

Embodiment 17 is the barrier adhesive composition of any of embodiments 1-14, wherein the barrier adhesive comprises 1.0-10 weight % of curable silsesquioxane additive.

Embodiment 18 is the barrier adhesive composition of any of embodiments 1-17, wherein the barrier adhesive is curable by exposure to actinic radiation or electron beam radiation.

Embodiment 19 is the barrier adhesive composition of embodiment 18, wherein the barrier adhesive is curable by exposure to actinic radiation, and the barrier adhesive composition further comprises a photoinitiator.

Embodiment 20 is the barrier adhesive composition of any of embodiments 1-19, wherein the curable silsesquioxane additive has been cured.

Also disclosed are barrier film article constructions. Embodiment 21 is a barrier film article construction comprising: a barrier film with a first major surface and a second major surface; and a pressure sensitive adhesive layer with a first major surface and a second major surface where the second major surface of the pressure sensitive adhesive layer is in contact with the first major surface of the barrier film, the pressure sensitive adhesive layer comprising at least one polyisobutylene-containing polymer and a curable or cured silsesquioxane additive.

Embodiment 22 is the barrier film article construction of embodiment 21, wherein the pressure sensitive adhesive layer is optically transparent.

Embodiment 23 is the barrier film article construction of embodiment 21 or 22, wherein the pressure sensitive adhesive layer is optically clear.

Embodiment 24 is the barrier film article construction of any of embodiments 21-23, wherein the curable or cured silsesquioxane additive is a cage silsesquioxane, a linear silsesquioxane, or a branched silsesquioxane.

Embodiment 25 is the barrier film article construction of any of embodiments 21-24, wherein the curable or cured silsesquioxane additive is a polyhedral oligomeric silsesquioxane.

Embodiment 26 is the barrier film article construction of any of embodiments 21-25, wherein the curable silsesquioxane additive is ethylenically unsaturated.

Embodiment 27 is the barrier film article construction of any of embodiments 21-26, wherein the curable silsesquioxane additive is (meth)acrylate-functional.

Embodiment 28 is the barrier film article construction of any of embodiments 21-27, wherein the cured silsesquioxane additive is a cured (meth)acrylate-functional silsesquioxane.

Embodiment 29 is the barrier film article construction of any of embodiments 21-28, wherein the barrier adhesive composition comprises at least one polyisobutylene-containing polymer having a viscosity average molecular weight of 40,000 to 2,600,000 grams/mole.

Embodiment 30 is the barrier film article construction of any of embodiments 21-29, wherein the barrier adhesive composition comprises at least one polyisobutylene-containing polymer having a viscosity average molecular weight of 40,000 to 1,000,000 g/mole.

Embodiment 31 is the barrier film article construction of any of embodiments 21-30, wherein the barrier adhesive composition comprises at least one polyisobutylene-containing polymer having a viscosity average molecular weight of 60,000 to 900,000 g/mole.

Embodiment 32 is the barrier film article construction of any of embodiments 21-31, wherein the barrier adhesive composition comprises at least one polyisobutylene-containing polymer having a viscosity average molecular weight of 85,000 to 800,000 g/mole.

Embodiment 33 is the barrier film article construction of any of embodiments 21-32, wherein the at least one polyisobutylene-containing polymer comprises a polyisobutylene polymer, a styrene-isobutylene copolymer, a butyl rubber polymer, or a combination thereof.

Embodiment 34 is the barrier film article construction of any of embodiments 31-33, wherein the at least one polyisobutylene-containing polymer comprises a mixture of two polyisobutylene polymers.

Embodiment 35 is the barrier film article construction of any of embodiments 21-34, wherein the adhesive composition further comprises at least one tackifying resin.

Embodiment 36 is the barrier film article construction of any of embodiments 21-35, wherein the barrier adhesive comprises 0.1-30 weight % of curable or cured silsesquioxane additive.

Embodiment 37 is the barrier film article construction of any of embodiments 21-35, wherein the barrier adhesive comprises 0.2-20 weight % of curable or cured silsesquioxane additive.

Embodiment 38 is the barrier film article construction of any of embodiments 21-35, wherein the barrier adhesive comprises 1.0-10 weight % of curable or cured silsesquioxane additive.

Embodiment 39 is the barrier film article construction of any of embodiments 21-38, wherein the barrier adhesive is curable by exposure to actinic radiation or electron beam radiation.

Embodiment 40 is the barrier film article construction of embodiment 39, wherein the barrier adhesive is curable by exposure to actinic radiation, and the barrier adhesive composition further comprises a photoinitiator.

Embodiment 41 is the barrier film article construction of any of embodiments 21-40, wherein the barrier film comprises a flexible polymeric film comprising ethylene vinyl alcohol copolymers, polyamides, polyolefins, polyesters, (meth)acrylates, or blends or mixtures thereof.

Embodiment 42 is the barrier film article construction of any of embodiments 21-41, wherein the barrier film comprises a visible light transmissive film.

Embodiment 43 is the barrier film article construction of any of embodiments 21-42, wherein the barrier film comprises a polyethylene terephthalate film.

Embodiment 44 is the barrier film article construction of any of embodiments 21-42, wherein the barrier film comprises a (meth)acrylate-based film.

Embodiment 45 is the barrier film article construction of any of embodiments 21-41, wherein the barrier film is an ultra-barrier film having an oxygen transmission rate less than 0.005 $cm^3/m^2$/day at 23° C. and 90% RH (relative humidity) and a water vapor transmission rate of less than 0.005 $g/m^2$/day at 23° C. and 90% RH.

Embodiment 46 is the barrier film article construction of any of embodiments 21-45, further comprising a releasing substrate, wherein the releasing substrate is in contact with the first major surface of the pressure sensitive adhesive layer.

Also disclosed are devices. Embodiment 47 is an encapsulated organic electronic device comprising: a device substrate; an organic electronic device disposed on the device substrate; and a barrier film article disposed on the organic electronic device and at least a portion of the device substrate, the barrier film article comprising: a barrier film with a first major surface and a second major surface; and a pressure sensitive adhesive layer with a first major surface and a second major surface where the second major surface of the pressure sensitive adhesive layer is in contact with the first major surface of the barrier film, the pressure sensitive adhesive layer comprising a polyisobutylene-containing polymer and a cured silsesquioxane additive, wherein the pressure sensitive adhesive layer of the barrier film article and the device substrate encapsulate the organic electronic device.

Embodiment 48 is the encapsulated organic electronic device of embodiment 47, wherein the pressure sensitive adhesive layer is optically transparent.

Embodiment 49 is the encapsulated organic electronic device of embodiment 47 or 48, wherein the pressure sensitive adhesive layer is optically clear.

Embodiment 50 is the encapsulated organic electronic device of any of embodiments 47-49, wherein the wherein the cured silsesquioxane additive is a cage silsesquioxane, a linear silsesquioxane, or a branched silsesquioxane.

Embodiment 51 is the encapsulated organic electronic device of any of embodiments 47-50, wherein the cured silsesquioxane additive is a polyhedral oligomeric silsesquioxane.

Embodiment 52 is the encapsulated organic electronic device of any of embodiments 47-51, wherein the cured silsesquioxane additive is prepared by curing a curable silsesquioxane additive that is ethylenically unsaturated.

Embodiment 53 is the encapsulated organic electronic device of embodiment 52, wherein the curable silsesquioxane additive is (meth)acrylate-functional.

Embodiment 54 is the encapsulated organic electronic device of any of embodiments 47-53, wherein the barrier adhesive composition comprises at least one polyisobutylene-containing polymer having a viscosity average molecular weight of 40,000 to 2,600,000 grams/mole.

Embodiment 55 is the encapsulated organic electronic device of any of embodiments 47-54, wherein the barrier adhesive composition comprises at least one polyisobutylene-containing polymer having a viscosity average molecular weight of 40,000 to 1,000,000 g/mole.

Embodiment 56 is the encapsulated organic electronic device of any of embodiments 47-55, wherein the barrier adhesive composition comprises at least one polyisobutylene-containing polymer having a viscosity average molecular weight of 60,000 to 900,000 g/mole.

Embodiment 57 is the encapsulated organic electronic device of any of embodiments 47-56, wherein the barrier adhesive composition comprises at least one polyisobutylene-containing polymer having a viscosity average molecular weight of 85,000 to 800,000 g/mole.

Embodiment 58 is the encapsulated organic electronic device of any of embodiments 47-57, wherein the at least one polyisobutylene-containing polymer comprises a polyisobutylene polymer, a styrene-isobutylene copolymer, a butyl rubber polymer, or a combination thereof.

Embodiment 59 is the encapsulated organic electronic device of any of embodiments 47-58, wherein the at least one polyisobutylene-containing polymer comprises a mixture of two polyisobutylene polymers.

Embodiment 60 is the encapsulated organic electronic device of any of embodiments 47-59, wherein the adhesive composition further comprises at least one tackifying resin.

Embodiment 61 is the encapsulated organic electronic device of any of embodiments 47-60, wherein the barrier adhesive comprises 0.1-30 weight % of cured silsesquioxane additive.

Embodiment 62 is the encapsulated organic electronic device of any of embodiments 47-61, wherein the barrier adhesive comprises 0.2-20 weight % of cured silsesquioxane additive.

Embodiment 63 is the encapsulated organic electronic device of any of embodiments 47-62, wherein the barrier adhesive comprises 1.0-10 weight % of cured silsesquioxane additive.

Embodiment 64 is the encapsulated organic electronic device of any of embodiments 47-63, wherein the barrier adhesive is curable by exposure to actinic radiation or electron beam radiation.

Embodiment 65 is the encapsulated organic electronic device of embodiment 64, wherein the barrier adhesive is curable by exposure to actinic radiation, and the barrier adhesive composition further comprises a photoinitiator.

Embodiment 66 is the encapsulated organic electronic device of any of embodiments 47-65, wherein the barrier film comprises a flexible polymeric film comprising ethylene vinyl alcohol copolymers, polyamides, polyolefins, polyesters, (meth)acrylates, or blends or mixtures thereof.

Embodiment 67 is the encapsulated organic electronic device of any of embodiments 47-66, wherein the barrier film comprises a visible light transmissive film.

Embodiment 68 is the encapsulated organic electronic device of any of embodiments 47-67, wherein the barrier film comprises a polyethylene terephthalate film.

Embodiment 69 is the encapsulated organic electronic device of any of embodiments 47-67, wherein the barrier film comprises a (meth)acrylate-based film.

Embodiment 70 is the encapsulated organic electronic device of any of embodiments 47-67, wherein the barrier film is an ultra-barrier film having an oxygen transmission rate less than 0.005 $cm^3/m^2$/day at 23° C. and 90% RH (relative humidity) and a water vapor transmission rate of less than 0.005 $g/m^2$/day at 23° C. and 90% RH.

Embodiment 71 is the encapsulated organic electronic device of any of embodiments 47-70, wherein the organic electronic device is an organic light emitting diode.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

These examples are merely for illustrative purposes only and are not meant to be limiting on the scope of the appended claims. All parts, percentages, ratios, etc. in the examples and the rest of the specification are by weight, unless noted otherwise. Materials used in the Examples and their sources are provided in Table 1. Solvents and other reagents used were obtained from Sigma-Aldrich Chemical Company, St. Louis, Mo., unless otherwise noted.

TABLE 1

Materials

| Material | Tradename (abbreviation) | Source (location) |
|---|---|---|
| Hydrogenated petroleum hydrocarbon resin (tackifier) | ESCOREZ 5300 (5300) | ExxonMobil Chemical Company (Houston, TX) |
| Polyisobutylene, | OPPANOL B15 (B15) | BASF (Florham Park, NJ) |
| Polyisobutylene, 400,000 g/mol | OPPANOL B50 SF (B50) | BASF (Florham Park, NJ) |
| Polyisobutylene, 800,000 g/mol | OPPANOL B80 (B80) | BASF (Florham Park, NJ) |
| Polyisobutylene | P85 (P85) | Evramov (Evramov, Russia) |
| Butyl rubber | 268S (268S) | ExxonMobil Chemical Company (Houston, TX) |
| Heptane | | VWR International (Radnor, PA) |
| Toluene | | VWR International (Radnor, PA) |
| Silicone release liner | SKC-02N | SKC Haas (Seoul, Korea) |
| Barrier film | FTB3-50 | 3M (St. Paul, MN) |
| Methacryl POSS cage mixture | MA0735 | Hybrid Plastics (Hattiesburg, MS) |
| Acrylo POSS cage mixture | MA0736 | Hybrid Plastics (Hattiesburg, MS) |
| Methacyryl-functional SSQ | SSQ-1 | Prepared in Synthesis Example 1 below. |
| Acryl-functional SSQ | SSQ-2 | Prepared in Synthesis Example 2 below |
| Non-functional SSQ | SSQ-butyl | Prepared in Synthesis Example 3 below |

Optical Properties Characterization

Transmission, haze, and clarity data were acquired using a BYK Gardner Haze-Gard Plus and are reported as percentages in Table 2 (% T, % H, % C). Optical measurements were made on adhesive-coated test substrates (described below) with the release liner removed.

Synthesis Examples: Preparation of SSQ Precursors

Synthesis Example 1: 80 Mol % Methyl 20 Mol % Methacryloxypropyl Silsesquioxane (SSQ-1)

To a mixture of water (70.8 g), methyl ethyl ketone (30.0 g), and aqueous hydrocholoric acid (1.32 g, 12.3% solution) was added a mixture of methacryloxypropyltrimethoxysilane (42.4 g, 0.17 mol, 4 equivalents), methyltrimethoxysilane (94.0 g, 0.690 mol, 1 equivalent) and hexamethyldisiloxane (40.0 g, 0.25 mol) over a period of 30 seconds at room temperature with stirring. The cloudy mixture was brought to reflux. After refluxing 5 minutes it became clear. After refluxing 10 minutes it became cloudy, and MEK (20 mL) was added, causing the mixture to again become clear. After refluxing 18 minutes the reaction again became cloudy and it was quenched by adding water (20 mL) to induce a phase split. The lower silsesquioxane phase was washed with water (3×20 mL) and the aqueous phases were discarded. The silsesquioxane solution was rotary evaporated (30 psi, 50° C., 20 minutes) to yield a clear colorless oil (168 g); viscosity 300 cps; SEC (THF, triple detection) Mn=2000, Mw=3010, Mw/Mn=1.50; $^{29}$Si NMR (d8-THF, 500 MHz, δ): 8 (OSiMe3), −51 (Si(OSi)O$_2$), −59 (Si(OSi)2O), −67 (—Si(OSi)$_3$).

Synthesis Example 2: 90 Mol % Methyl 10 Mol % Acryloxypropyl Silsesquioxane (SSQ-2)

To a mixture of water (70.8 g), methyl ethyl ketone (30.0 g), and aqueous hydrocholoric acid (1.32 g, 12.3% solution) was added a mixture of acryloxypropyltrimethoxysilane (21.1 g, 0.09 mol, 1 equivalent), methyltrimethoxysilane (104.9 g, 0.77 mol, 9 equivalent) and hexamethyldisiloxane (40.0 g, 0.25 mol) over a period of 30 seconds at room temperature with stirring. The cloudy mixture was brought to reflux. After refluxing 5 minutes it became clear. After refluxing 10 minutes it became cloudy, and MEK (20 mL) was added, causing the mixture to again become clear. After refluxing 18 minutes the reaction again became cloudy and it was quenched by adding water (20 mL) to induce a phase split. The lower silsesquioxane phase was washed with water (3×20 mL) and the aqueous phases were discarded. The silsesquioxane solution was rotary evaporated (30 torr, 50° C., 20 minutes) to yield a clear colorless oil (79.6 g); viscosity 350 cps; $^{29}$Si NMR (d8-THF, 500 MHz, δ): 7 (OSiMe3), −53 (Si(OSi)O2), −57 (Si(OSi)2O), −65 (—Si(OSi)$_3$).

Synthesis Example 3: 100 Mol % n-Butyl Silsesquioxane

To a mixture of water (11.4 g), methyl ethyl ketone (MEK) (2.5 g), and aqueous hydrocholoric acid (0.21 g, 12.3% solution) was added a mixture of n-butyltrimethoxysilane (24.7 g, 0.139 mol) and hexamethyldisiloxane (6.4 g, 0.039 mol) over a period of 30 seconds at room temperature with stirring. The cloudy mixture was left to reflux. At 2 minutes it became clear. At 15 minutes it became cloudy, MEK (20 mL) was added, and the mixture became clear. At 40 minutes the reaction became cloudy and was quenched by adding aqueous sodium hydrogen carbonate (0.2 g sodium hydrogen carbonate in 10 mL water) to induce a phase split. The lower silsesquioxane phase was washed with water (3×15 mL) and the aqueous phases were discarded. The silsesquioxane solution was rotary evaporated (30 psi, 50° C., 20 min) to yield a clear colorless oil (19.7 g) stored in 10 wt % methyl ethyl ketone solution. $^{29}$Si NMR (d6-acetone, 500 MHz, δ): 8 (OSiMe3), −52 (Si(OSi)O2), −57 (Si(OSi)2O), −67 (—Si(OSi)$_3$); SEC (THF, triple detection) Mn=1200, Mw=1700, Mw/Mn=1.42.

Examples 1-22 Including Comparative Examples

Preparation of Polyisobutylene-Based Adhesive Mixtures

The polyisobutylene and butyl rubber polymer resins were first diced into approximately 1 inch cubes and then added to an amber jar, except for polyisobutylene B15, which was warmed until flow and then added to an amber jar. For each adhesive mixture, the resins were combined with n-heptane (solvent), tackifier, and POSS additive (if used) in the amber jar according to the ratios provided in Table 2. In Table 2, pphr refers to "parts per hundred resin"; for the examples in which the POSS or SSQ additive is added on a pphr basis, it is added at the indicated weight percent of the total weight of the polyisobutylene, butyl rubber, and tackifier indicated for that example. Also, twb refers to "total weight basis"; for the examples in which the POSS or SSQ additive is added on a twb basis, the indicated weight percentage is of all components of the formulation, e.g., the sum of the polyisobutylene, butyl rubber, tackifier, and POSS or SSQ additive. The sealed amber jars containing the adhesive formulations were mixed on a tube roller at room temperature (about 23° C.) for 24 hours.

(WVTR) is directly proportional to the time needed for the optical density to reach 50% of its initial value. The hours

TABLE 2

Formulations of adhesives, with calcium testing results and optical performance results of corresponding adhesive-coated barrier film samples.

| | Adhesive Materials (wt %) | | | | | | POSS or SSQ Additive | | Time to 50% OD loss | Optical Performance | | |
|---|---|---|---|---|---|---|---|---|---|---|---|---|
| | B15 | B50 | B80 | P85 | 268S | 5300 | Identifier | wt %* | hours | % T | % H | % C |
| Comparative Example 1 | — | 25 | 50 | — | — | 25 | none | — | 345 | 93.4 | 0.92 | 99 |
| Example 2 | — | 25 | 50 | — | — | 25 | MA0736 | 1 pphr | 623 | — | — | — |
| Example 3 | — | 25 | 50 | — | — | 25 | MA0736 | 2.5 pphr | 506 | 93.6 | 1.32 | 98.9 |
| Example 4 | — | 25 | 50 | — | — | 25 | MA0736 | 5 pphr | 552 | 93.6 | 1.29 | 98.9 |
| Example 5 | — | 25 | 50 | — | — | 25 | MA0736 | 20 pphr | 506 | — | — | — |
| Comparative Example 6 | — | — | — | 75 | — | 25 | none | — | 483 | 92.8 | 1.35 | 98.9 |
| Example 7 | — | — | — | 75 | — | 25 | MA0735 | 2 pphr | 700 | 92.7 | 1.02 | 99 |
| Comparative Example 8 | — | 25 | 50 | — | — | 25 | none | — | 372 | — | — | — |
| Example 9 | — | 24.25 | 48 | — | — | 24.25 | SSQ-1 | 3 twb | 627 | 93.1 | 1.37 | 99 |
| Example 10 | — | 24.25 | 48 | — | — | 24.25 | SSQ-2 | 3 twb | 675 | 94.5 | 5.17 | 98.8 |
| Comparative Example 11 | — | 25 | 50 | — | — | 25 | none | — | 430 | — | — | — |
| Example 12 | 4 | — | — | — | 75 | 20 | MA0735 | 1 twb | 744 | 93 | 0.98 | 98 |
| Example 13 | 4 | — | — | — | 72 | 19 | MA0735 | 5 twb | 707 | 92.8 | 1 | 99 |
| Comparative Example 14 | — | 25 | 50 | — | — | 25 | none | — | 366 | — | — | — |
| Example 15 | — | 25 | 50 | — | — | 25 | SSQ-1 | 1 pphr | 628 | — | — | — |
| Example 16 | — | 25 | 50 | — | — | 25 | MA0736 | 0.5 pphr | 508 | 93.3 | 1.28 | 98.8 |
| Example 17 | — | — | — | 84.2 | — | 14.9 | SSQ-1 | 1 twb | 632.5 | — | — | — |
| Example 18 | — | — | — | 84.6 | — | 14.9 | SSQ-1 | 0.5 twb | 850.5 | — | — | — |
| Example 19 | — | — | — | 84.8 | — | 14.5 | SSQ-1 | 0.2 twb | 789 | — | — | — |
| Example 20 | — | — | — | 84.9 | — | 15 | SSQ-1 | 0.1 twb | 863 | — | — | — |
| Comparative Example 21 | 15 | — | — | 85 | — | — | None | — | 602.5 | — | — | — |
| Example 22 | 14.9 | — | — | 84.2 | — | — | SSQ-1 | 1 twb | 675 | — | — | — |

*pphr = parts per hundred resin; twb = total weight basis

Coating of Adhesive Formulations onto Film Substrates

The adhesive solutions were applied onto a silicone release liner (SKC-02N) provided by SKC Haas. The applied solutions were knife coated (8 mil knife height) to form a uniform wet layer, followed by drying at 70° C. for 30 minutes in a convection oven, resulting in 1 mil thick dry adhesive coatings. Barrier film (3M FTB3-50) was then laminated with a hand roller onto the surface of the adhesives, with the dyad (barrier coating) side of the barrier film facing the adhesives, producing adhesive-coated test substrates.

Calcium Testing

The silicone release liners were removed and the adhesive-coated barrier film samples were first baked in vacuum at 80° C. until moisture was removed. Reflective metallic calcium was thermally deposited on specified regions of a glass substrate (e.g., an array of squares). The adhesive-coated barrier film was disposed on the calcium-coated glass substrate, and this sandwich was laminated with a hand roller. Schematic representation of these laminated test articles is provided in FIGS. 1 and 2. The adhesive was 25 micrometers thick in each of the laminated test articles. Using a densitometer, optical density (OD) of the calcium squares was measured at the initial time. The laminated test articles were then placed in an environmental chamber for accelerated aging at 60° C. and 90% relative humidity. For the first three days, optical densities were measured twice per day. Optical density was then measured once per day until the optical density of the calcium squares was 50% of the initial density. The water vapor transmission rate required for the optical densities to reach half of the initial optical densities are provided in Table 2.

What is claimed is:

1. A barrier adhesive composition comprising:
at least one polyisobutylene-containing polymer; and
a curable silsesquioxane additive, wherein the adhesive composition comprises 0.1-30 weight % of curable silsesquioxane additive based on the total weight composition of the barrier adhesive composition.

2. The barrier adhesive composition of claim 1, wherein the barrier adhesive composition is optically clear.

3. The barrier adhesive composition of claim 1, wherein the curable silsesquioxane additive is a cage silsesquioxane, a linear silsesquioxane, or a branched silsesquioxane.

4. The barrier adhesive composition of claim 1, wherein the curable silsesquioxane additive is a polyhedral oligomeric silsesquioxane.

5. The barrier adhesive composition of claim 1, wherein the curable silsesquioxane additive is (meth)acrylate-functional.

6. The barrier adhesive composition of claim 1, wherein the adhesive composition comprises at least one polyisobutylene-containing polymer having a viscosity average molecular weight of 40,000 to 2,600,000 grams/mole.

7. The barrier adhesive composition of claim 1, wherein the at least one polyisobutylene-containing polymer comprises a polyisobutylene polymer, a styrene-isobutylene copolymer, a butyl rubber polymer, or a combination thereof.

8. The barrier adhesive composition of claim 1, wherein the at least one polyisobutylene-containing polymer comprises a mixture of two polyisobutylene-containing polymers.

9. The barrier adhesive composition of claim 1, further comprising at least one tackifying resin.

10. The barrier adhesive composition of claim 1, wherein the adhesive composition is curable by exposure to actinic radiation or electron beam radiation.

11. A barrier film article construction comprising:
   a barrier film with a first major surface and a second major surface; and
   a pressure sensitive adhesive layer with a first major surface and a second major surface where the second major surface of the pressure sensitive adhesive layer is in contact with the first major surface of the barrier film, the pressure sensitive adhesive layer comprising at least one polyisobutylene-containing polymer, and a cured or curable silsesquioxane additive, and wherein the adhesive composition comprises 0.1-30 weight % of curable silsesquioxane additive based on the total weight composition of the barrier adhesive composition.

12. The barrier film article of claim 11, wherein the barrier film comprises a flexible polymeric film comprising ethylene vinyl alcohol copolymers, polyamides, polyolefins, polyesters, (meth)acrylates, or blends or mixtures thereof.

13. The barrier film article of claim 11, wherein the barrier film comprises a visible light transmissive film.

14. The barrier film article of claim 11, wherein the barrier film is an ultra-barrier film having an oxygen transmission rate less than 0.005 $cm^3/m^2$/day at 23° C. and 90% RH (relative humidity) and a water vapor transmission rate of less than 0.005 $g/m^2$/day at 23° C. and 90% RH.

15. The barrier film article of claim 11, wherein the pressure sensitive adhesive layer comprises at least one tackifying resin.

16. The barrier film article of claim 11, further comprising a releasing substrate, wherein the releasing substrate is in contact with the first major surface of the pressure sensitive adhesive layer.

17. An encapsulated organic electronic device comprising:
   a device substrate;
   an organic electronic device disposed on the device substrate; and
   a barrier film article disposed on the organic electronic device and at least a portion of the device substrate, the barrier film article comprising:
      a barrier film with a first major surface and a second major surface; and
      a pressure sensitive adhesive layer with a first major surface and a second major surface where the second major surface of the pressure sensitive adhesive layer is in contact with the first major surface of the barrier film, the pressure sensitive adhesive layer comprising a polyisobutylene-containing polymer, and a cured silsesquioxane additive, wherein the pressure sensitive adhesive layer of the barrier film article and the device substrate encapsulate the organic electronic device, and wherein the adhesive composition comprises 0.1-30 weight % of curable silsesquioxane additive based on the total weight composition of the barrier adhesive composition.

18. The encapsulated organic electronic device of claim 17, wherein the organic electronic device is an organic light emitting diode.

19. The encapsulated organic electronic device of claim 17, wherein the organic electronic device is a sensing device, an electronic label, or a liquid crystal diode (LCD) device.

20. The encapsulated organic electronic device of claim 17, wherein the pressure sensitive adhesive layer further comprises at least one tackifying resin.

* * * * *